United States Patent
Sant et al.

(10) Patent No.: US 8,865,598 B2
(45) Date of Patent: Oct. 21, 2014

(54) METHOD FOR POSITIONING SPACERS IN PITCH MULTIPLICATION

(71) Applicant: Micron Technology, Inc., Boise, ID (US)

(72) Inventors: Sanket Sant, Plano, TX (US); Gurtej Sandhu, Boise, ID (US); Neal R. Rueger, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/094,473

(22) Filed: Dec. 2, 2013

(65) Prior Publication Data

US 2014/0087563 A1   Mar. 27, 2014

Related U.S. Application Data

(60) Continuation of application No. 13/447,520, filed on Apr. 16, 2012, now Pat. No. 8,598,041, which is a continuation of application No. 13/179,851, filed on Jul. 11, 2011, now Pat. No. 8,173,550, which is a division of application No. 12/489,337, filed on Jun. 22, 2009, now Pat. No. 8,003,542, which is a division of application No. 11/144,543, filed on Jun. 2, 2005, now Pat. No. 7,560,390.

(51) Int. Cl.
| | |
|---|---|
| *H01L 21/302* | (2006.01) |
| *H01L 27/105* | (2006.01) |
| *H01L 21/308* | (2006.01) |
| *H01L 21/033* | (2006.01) |

(52) U.S. Cl.
CPC ........ *H01L 21/0337* (2013.01); *H01L 27/1052* (2013.01); *H01L 21/3086* (2013.01); *H01L 21/3088* (2013.01)
USPC ............................. 438/717; 438/736; 438/737

(58) Field of Classification Search
USPC .......... 438/717, 725, 736, 737; 257/E21.026, 257/E21.027
See application file for complete search history.

(56) References Cited

U.S. PATENT DOCUMENTS

| | | | |
|---|---|---|---|
| 4,234,362 | A | 11/1980 | Riseman |
| 4,419,809 | A | 12/1983 | Riseman et al. |

(Continued)

FOREIGN PATENT DOCUMENTS

| | | |
|---|---|---|
| DE | 280851 | 7/1990 |
| DE | 42 36 609 A1 | 5/1994 |

(Continued)

OTHER PUBLICATIONS

Bergeron, et al. "Resolution Enhancement Techniques for the 90nm Technology Node and Beyond," Future Fab International, Issue 15, Jul. 11, 2003, 4 pages.

(Continued)

*Primary Examiner* — Hsien Ming Lee
(74) *Attorney, Agent, or Firm* — Knobbe, Martens, Olson & Bear LLP

(57) ABSTRACT

Multiple pitch-multiplied spacers are used to form mask patterns having features with exceptionally small critical dimensions. One of each pair of spacers formed mandrels is removed and alternating layers, formed of two mutually selectively etchable materials, are deposited around the remaining spacers. Layers formed of one of the materials are then etched, leaving behind vertically-extending layers formed of the other of the materials, which form a mask pattern. Alternatively, instead of depositing alternating layers, amorphous carbon is deposited around the remaining spacers followed by a plurality of cycles of forming pairs of spacers on the amorphous carbon, removing one of the pairs of spacers and depositing an amorphous carbon layer. The cycles can be repeated to form the desired pattern. Because the critical dimensions of some features in the pattern can be set by controlling the width of the spaces between spacers, exceptionally small mask features can be formed.

19 Claims, 41 Drawing Sheets

(56) References Cited

U.S. PATENT DOCUMENTS

| | | |
|---|---|---|
| 4,432,132 A | 2/1984 | Kinsbron et al. |
| 4,502,914 A | 3/1985 | Trumpp et al. |
| 4,508,579 A | 4/1985 | Goth et al. |
| 4,570,325 A | 2/1986 | Higuchi |
| 4,648,937 A | 3/1987 | Ogura et al. |
| 4,716,131 A | 12/1987 | Okazawa et al. |
| 4,776,922 A | 10/1988 | Bhattacharyya et al. |
| 4,803,181 A | 2/1989 | Buchmann et al. |
| 4,838,991 A | 6/1989 | Cote et al. |
| 5,013,680 A | 5/1991 | Lowrey et al. |
| 5,047,117 A | 9/1991 | Roberts |
| 5,053,105 A | 10/1991 | Fox, III |
| 5,117,027 A | 5/1992 | Bernhardt et al. |
| 5,328,810 A | 7/1994 | Lowrey et al. |
| 5,330,879 A | 7/1994 | Dennison |
| 5,470,661 A | 11/1995 | Bailey et al. |
| 5,514,885 A | 5/1996 | Myrick |
| 5,593,813 A | 1/1997 | Kim |
| 5,670,794 A | 9/1997 | Manning |
| 5,753,546 A | 5/1998 | Koh et al. |
| 5,789,320 A | 8/1998 | Andricacos et al. |
| 5,795,830 A | 8/1998 | Cronin et al. |
| 5,830,332 A | 11/1998 | Babich et al. |
| 5,858,620 A | 1/1999 | Ishibashi et al. |
| 5,895,740 A | 4/1999 | Chien et al. |
| 5,899,746 A | 5/1999 | Mukai |
| 5,998,256 A | 12/1999 | Juengling |
| 6,004,862 A | 12/1999 | Kim et al. |
| 6,010,946 A | 1/2000 | Hisamune et al. |
| 6,020,255 A | 2/2000 | Tsai et al. |
| 6,042,998 A | 3/2000 | Brueck et al. |
| 6,057,573 A | 5/2000 | Kirsch et al. |
| 6,063,688 A | 5/2000 | Doyle et al. |
| 6,071,789 A | 6/2000 | Yang et al. |
| 6,110,837 A | 8/2000 | Linliu et al. |
| 6,143,476 A | 11/2000 | Ye et al. |
| 6,207,490 B1 | 3/2001 | Lee |
| 6,211,044 B1 | 4/2001 | Xiang et al. |
| 6,288,454 B1 | 9/2001 | Allman et al. |
| 6,291,334 B1 | 9/2001 | Somekh |
| 6,297,554 B1 | 10/2001 | Lin |
| 6,335,257 B1 | 1/2002 | Tseng |
| 6,348,380 B1 | 2/2002 | Weimer et al. |
| 6,362,057 B1 | 3/2002 | Taylor, Jr. et al. |
| 6,383,907 B1 | 5/2002 | Hasegawa et al. |
| 6,395,613 B1 | 5/2002 | Juengling |
| 6,423,474 B1 | 7/2002 | Holscher |
| 6,455,372 B1 | 9/2002 | Weimer |
| 6,475,867 B1 | 11/2002 | Hui et al. |
| 6,500,756 B1 | 12/2002 | Bell et al. |
| 6,514,884 B2 | 2/2003 | Maeda |
| 6,522,584 B1 | 2/2003 | Chen et al. |
| 6,534,243 B1 | 3/2003 | Templeton |
| 6,548,396 B2 | 4/2003 | Naik et al. |
| 6,559,017 B1 | 5/2003 | Brown et al. |
| 6,566,280 B1 | 5/2003 | Meagley et al. |
| 6,573,030 B1 | 6/2003 | Fairbairn et al. |
| 6,602,779 B1 | 8/2003 | Li et al. |
| 6,620,715 B1 | 9/2003 | Blosse et al. |
| 6,632,741 B1 | 10/2003 | Clevenger et al. |
| 6,638,441 B2 | 10/2003 | Chang et al. |
| 6,667,237 B1 | 12/2003 | Metzler |
| 6,673,684 B1 | 1/2004 | Huang et al. |
| 6,686,245 B1 | 2/2004 | Mathew et al. |
| 6,689,695 B1 | 2/2004 | Lui et al. |
| 6,706,571 B1 | 3/2004 | Yu et al. |
| 6,709,807 B2 | 3/2004 | Hallock et al. |
| 6,734,107 B2 | 5/2004 | Lai et al. |
| 6,744,094 B2 | 6/2004 | Forbes |
| 6,762,449 B2 | 7/2004 | Uchiyama et al. |
| 6,773,998 B1 | 8/2004 | Fisher et al. |
| 6,794,699 B2 | 9/2004 | Bissey et al. |
| 6,800,930 B2 | 10/2004 | Jackson et al. |
| 6,818,141 B1 | 11/2004 | Plat et al. |
| 6,835,662 B1 | 12/2004 | Erhardt et al. |
| 6,867,116 B1 | 3/2005 | Chung |
| 6,875,703 B1 | 4/2005 | Furukawa et al. |
| 6,893,972 B2 | 5/2005 | Rottstegge et al. |
| 6,911,695 B2 | 6/2005 | Ahmed et al. |
| 6,916,594 B2 | 7/2005 | Bok |
| 6,924,191 B2 | 8/2005 | Liu et al. |
| 6,955,961 B1 | 10/2005 | Cheng |
| 6,962,867 B2 | 11/2005 | Jackson et al. |
| 7,015,124 B1 | 3/2006 | Fisher et al. |
| 7,074,668 B1 | 7/2006 | Park et al. |
| 7,084,076 B2 | 8/2006 | Park et al. |
| 7,115,525 B2 | 10/2006 | Abatchev et al. |
| 7,183,142 B2 * | 2/2007 | Anderson et al. ............ 438/142 |
| 7,183,205 B2 | 2/2007 | Hong |
| 7,183,597 B2 | 2/2007 | Doyle |
| 7,202,174 B1 | 4/2007 | Jung |
| 7,208,379 B2 | 4/2007 | Venugopal et al. |
| 7,271,107 B2 | 9/2007 | Marks et al. |
| 7,288,445 B2 | 10/2007 | Bryant et al. |
| 7,291,560 B2 | 11/2007 | Parascandola et al. |
| 7,378,727 B2 | 5/2008 | Caspary et al. |
| 7,429,536 B2 | 9/2008 | Abatchev et al. |
| 7,442,976 B2 | 10/2008 | Juengling |
| 7,537,866 B2 | 5/2009 | Liu |
| 7,851,135 B2 | 12/2010 | Jung |
| 7,910,288 B2 | 3/2011 | Abatchev et al. |
| 2001/0005631 A1 | 6/2001 | Kim et al. |
| 2002/0042198 A1 | 4/2002 | Bjarnason et al. |
| 2002/0045308 A1 | 4/2002 | Juengling |
| 2002/0063110 A1 | 5/2002 | Cantell et al. |
| 2002/0068243 A1 | 6/2002 | Hwang et al. |
| 2002/0094688 A1 | 7/2002 | Mitsuiki |
| 2002/0127810 A1 | 9/2002 | Nakamura |
| 2003/0006410 A1 | 1/2003 | Doyle |
| 2003/0044722 A1 | 3/2003 | Hsu et al. |
| 2003/0091936 A1 | 5/2003 | Rottstegge et al. |
| 2003/0109102 A1 | 6/2003 | Kujirai et al. |
| 2003/0119307 A1 | 6/2003 | Bekiaris et al. |
| 2003/0127426 A1 | 7/2003 | Chang et al. |
| 2003/0157436 A1 | 8/2003 | Manger et al. |
| 2003/0207207 A1 | 11/2003 | Li |
| 2003/0207584 A1 | 11/2003 | Sivakumar et al. |
| 2003/0215978 A1 | 11/2003 | Maimon et al. |
| 2003/0216050 A1 | 11/2003 | Golz et al. |
| 2003/0230234 A1 | 12/2003 | Nam et al. |
| 2004/0000534 A1 | 1/2004 | Lipinski |
| 2004/0017989 A1 | 1/2004 | So |
| 2004/0018738 A1 | 1/2004 | Liu |
| 2004/0023475 A1 | 2/2004 | Bonser et al. |
| 2004/0023502 A1 | 2/2004 | Tzou et al. |
| 2004/0041189 A1 | 3/2004 | Voshell et al. |
| 2004/0043623 A1 | 3/2004 | Liu et al. |
| 2004/0053475 A1 | 3/2004 | Sharma |
| 2004/0079988 A1 | 4/2004 | Harari |
| 2004/0106257 A1 | 6/2004 | Okamura et al. |
| 2004/0235255 A1 | 11/2004 | Tanaka et al. |
| 2005/0074949 A1 | 4/2005 | Jung et al. |
| 2005/0112886 A1 | 5/2005 | Asakawa et al. |
| 2005/0142497 A1 | 6/2005 | Ryou |
| 2005/0153562 A1 | 7/2005 | Furukawa et al. |
| 2005/0164454 A1 | 7/2005 | Leslie |
| 2005/0167394 A1 | 8/2005 | Liu et al. |
| 2005/0186705 A1 | 8/2005 | Jackson et al. |
| 2005/0272259 A1 | 12/2005 | Hong |
| 2006/0003182 A1 | 1/2006 | Lane et al. |
| 2006/0011947 A1 | 1/2006 | Juengling |
| 2006/0024940 A1 | 2/2006 | Furukawa et al. |
| 2006/0024945 A1 | 2/2006 | Kim et al. |
| 2006/0046161 A1 | 3/2006 | Yin et al. |
| 2006/0046200 A1 | 3/2006 | Abatchev et al. |
| 2006/0046201 A1 | 3/2006 | Sandhu et al. |
| 2006/0046422 A1 | 3/2006 | Tran et al. |
| 2006/0046484 A1 | 3/2006 | Abatchev et al. |
| 2006/0083996 A1 | 4/2006 | Kim |
| 2006/0115978 A1 | 6/2006 | Specht |
| 2006/0172540 A1 | 8/2006 | Marks et al. |
| 2006/0189150 A1 | 8/2006 | Jung |
| 2006/0211260 A1 | 9/2006 | Tran et al. |
| 2006/0216923 A1 | 9/2006 | Tran et al. |

(56) References Cited

U.S. PATENT DOCUMENTS

| | | |
|---|---|---|
| 2006/0231900 A1 | 10/2006 | Lee et al. |
| 2006/0234138 A1 | 10/2006 | Fehlhaber et al. |
| 2006/0263699 A1 | 11/2006 | Abatchev et al. |
| 2006/0267075 A1 | 11/2006 | Sandhu et al. |
| 2006/0273456 A1 | 12/2006 | Sant et al. |
| 2006/0281266 A1 | 12/2006 | Wells |
| 2007/0026672 A1 | 2/2007 | Tang et al. |
| 2007/0045712 A1 | 3/2007 | Haller et al. |
| 2007/0048674 A1 | 3/2007 | Wells |
| 2007/0049011 A1 | 3/2007 | Tran |
| 2007/0049030 A1 | 3/2007 | Sandhu et al. |
| 2007/0049032 A1 | 3/2007 | Abatchev et al. |
| 2007/0049035 A1 | 3/2007 | Tran |
| 2007/0049040 A1 | 3/2007 | Bai et al. |
| 2007/0050748 A1 | 3/2007 | Juengling |
| 2007/0077524 A1 | 4/2007 | Koh |
| 2007/0210449 A1 | 9/2007 | Caspary et al. |
| 2007/0215874 A1 | 9/2007 | Furukawa et al. |
| 2007/0215960 A1 | 9/2007 | Zhu et al. |
| 2007/0275309 A1 | 11/2007 | Liu |
| 2008/0054350 A1 | 3/2008 | Breitwisch et al. |
| 2008/0292991 A1 | 11/2008 | Wallow et al. |

FOREIGN PATENT DOCUMENTS

| | | |
|---|---|---|
| EP | 0 227 303 A2 | 7/1987 |
| EP | 0 491 408 A2 | 6/1992 |
| EP | 1 357 433 A2 | 10/2003 |
| JP | 57-048237 | 3/1982 |
| JP | 64-035916 | 2/1989 |
| JP | 05-343370 | 12/1993 |
| JP | H08-55908 | 2/1996 |
| JP | H08-55920 | 2/1996 |
| JP | 2000-208434 | 7/2000 |
| JP | 2000-357736 | 12/2000 |
| JP | 2004-080033 | 3/2004 |
| JP | 2004-152784 | 5/2004 |
| JP | 2005-150333 | 6/2005 |
| JP | 2006-351861 | 1/2012 |
| KR | 10-1995-0034748 | 12/1995 |
| KR | 10-0122315 | 9/1997 |
| KR | 10-1999-0001440 | 1/1999 |
| KR | 10-1999-027887 | 4/1999 |
| WO | WO 94/15261 | 7/1994 |
| WO | WO 02/099864 A1 | 12/2002 |
| WO | WO 04/001799 A2 | 12/2003 |
| WO | WO 2004/003977 | 1/2004 |
| WO | WO 2005/010973 | 2/2005 |
| WO | WO 2005/034215 A1 | 4/2005 |
| WO | WO 2006/026699 A2 | 3/2006 |

OTHER PUBLICATIONS

Bhave et al. "Developer-soluble Gap fill materials for patterning metal trenches in Via-first Dual Damascene process," preprint of Proceedings of SPIE: Advances in Resist Technology and Processing XXI vol. 5376, 2004, John L. Sturtevant, editor, 8 pages.

Bruek, "Optical and Interferometric Lithography—Nanotechnology Enablers," 2005, Proceedings of the IEEE, vol. 93, No. 10, pp. 1704-1721.

Choi et al. "Sublithographic nanofabrication technology for nanocatalysts and DNA chips," *J. Vac. Sci. Technol.*, Nov./Dec. 2003; pp. 2951-2955.

Chung et al. "Nanoscale Multi-Line Patterning Using Sidewall Structure," Jpn., J. App.. Phys. vol. 41 (2002) Pt. 1, No. 6B, pp. 4410-4414.

Chung et al. "Pattern multiplication method and the uniformity of nanoscale multiple lines," J.Vac.Sci.Technol. B21(4), Jul./Aug. 2003, pp. 1491-1495.

U.S. Appl. No. 11/543,515, filed Oct. 24, 2006.

Ex parte Cantell, unpublished decision of the Board of Patent Appeals and Interferences, Mar. 4, 2005.

Joubert et al. "Nanometer scale linewidth control during etching of polysilicon gates in high-density plasmas," Microelectronic Engineering 69 (2003), pp. 350-357.

Oehrlein et al. "Pattern transfer into low dielectric materials by high-density plasma etching," Solid State Tech., May 2000, 8 pages.

Office Action of Jun. 2, 2008 in U.S. Appl. No. 11/219,067, filed Sep. 1, 2005.

Office Action of Jun. 5, 2008 in U.S. Appl. No. 11/514,117, filed Aug. 30, 2006.

Office Action of Jul. 11, 2008 in U.S. Appl. No. 11/367,020, filed Mar. 2, 2006.

Sheats et al., "Microlithography: Science and Technology," 1998, Marcel Dekkar, Inc., pp. 104-105.

\* cited by examiner

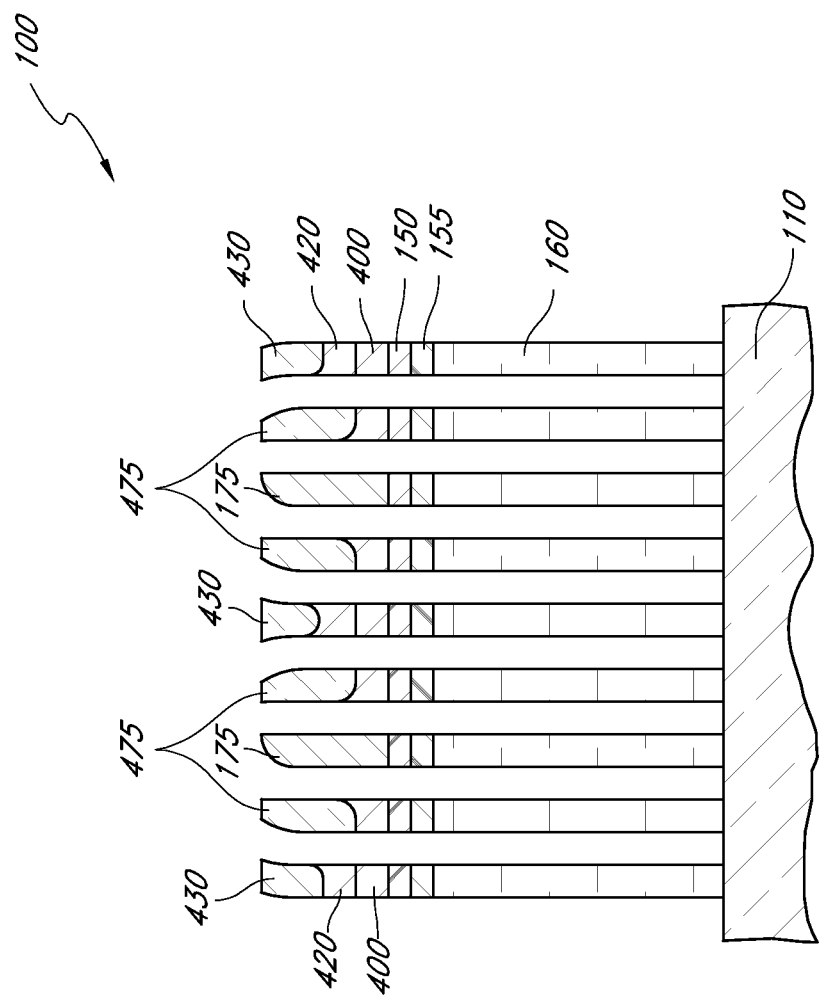

METHOD FOR POSITIONING SPACERS IN PITCH MULTIPLICATION

REFERENCE TO RELATED APPLICATIONS

This application is a continuation of U.S. patent application Ser. No. 13/447,520, filed Apr. 16, 2012, entitled MULTIPLE SPACER STEPS FOR PITCH MULTIPLICATION; which is a continuation of U.S. patent application Ser. No. 13/179,851, filed Jul. 11, 2011, entitled MULTIPLE SPACER STEPS FOR PITCH MULTIPLICATION (now U.S. Pat. No. 8,173,550); which is a divisional of U.S. patent application Ser. No. 12/489,337, filed Jun. 22, 2009, entitled MULTIPLE SPACER STEPS FOR PITCH MULTIPLICATION (now U.S. Pat. No. 8,003,542); which is a divisional of U.S. patent application Ser. No. 11/144,543, filed Jun. 2, 2005, entitled MULTIPLE SPACER STEPS FOR PITCH MULTIPLICATION (now U.S. Pat. No. 7,560,390).

In addition, this application is related to the following: U.S. patent application Ser. No. 10/931,772 to Abatchev et al., filed Aug. 31, 2004; U.S. patent application Ser. No. 10/932,993 to Abatchev et al., filed Sep. 1, 2004; U.S. patent application Ser. No. 10/931,771 to Tran et al., filed Aug. 31, 2004; U.S. patent application Ser. No. 10/934,317 to Sandhu et al., filed Sep. 2, 2004; U.S. patent application Ser. No. 10/934,778 to Abatchev et al., filed Sep. 2, 2004; and U.S. Patent Provisional Application No. 60/662,323 to Tran et al., filed Mar. 15, 2005, entitled Pitch Reduced Patterns Relative To Photolithography Features, (Micron Ref. No. 2004-1130.00/US).

BACKGROUND OF THE INVENTION

1. Field of the Invention

This invention relates generally to integrated circuit fabrication and, more particularly, to masking techniques.

2. Description of the Related Art

As a consequence of many factors, including demand for increased portability, computing power, memory capacity and energy efficiency, integrated circuits are continuously being reduced in size. The sizes of the constituent features that form the integrated circuits, e.g., electrical devices and interconnect lines, are also constantly being decreased to facilitate this size reduction.

The trend of decreasing feature size is evident, for example, in memory circuits or devices such as dynamic random access memories (DRAMs), flash memory, static random access memories (SRAMs), ferroelectric (FE) memories, etc. To take one example, DRAM typically comprises millions of identical circuit elements, known as memory cells. In its most general form, a memory cell typically consists of two electrical devices: a storage capacitor and an access field effect transistor. Each memory cell is an addressable location that can store one bit (binary digit) of data. A bit can be written to a cell through the transistor and can be read by sensing charge in the capacitor. By decreasing the sizes of the electrical devices that constitute a memory cell and the sizes of the conducting lines that access the memory cells, the memory devices can be made smaller. Storage capacities and speeds can be increased by fitting more memory cells on a given area in the memory devices.

The continual reduction in feature sizes places ever greater demands on the techniques used to form the features. For example, photolithography is commonly used to pattern features, such as conductive lines. The concept of pitch can be used to describe the sizes of these features. Pitch is defined as the distance between an identical point in two neighboring features. These features are typically defined by spaces between adjacent features, which spaces are typically filled by a material, such as an insulator. As a result, pitch can be viewed as the sum of the width of a feature and of the width of the space on one side of the feature separating that feature from a neighboring feature. However, due to factors such as optics and light or radiation wavelength, photolithography techniques each have a minimum pitch below which a particular photolithographic technique cannot reliably form features. Thus, the minimum pitch of a photolithographic technique is an obstacle to continued feature size reduction.

"Pitch doubling" or "pitch multiplication" is one proposed method for extending the capabilities of photolithographic techniques beyond their minimum pitch. A pitch multiplication method is illustrated in FIGS. 1A-1F and described in U.S. Pat. No. 5,328,810, issued to Lowrey et al., the entire disclosure of which is incorporated herein by reference. With reference to FIG. 1A, a pattern of lines 10 is photolithographically formed in a photoresist layer, which overlies a layer 20 of an expendable material, which in turn overlies a substrate 30. As shown in FIG. 1B, the pattern is then transferred using an etch (preferably an anisotropic etch) to the layer 20, thereby forming placeholders, or mandrels, 40. The photoresist lines 10 can be stripped and the mandrels 40 can be isotropically etched to increase the distance between neighboring mandrels 40, as shown in FIG. 1C. A layer 50 of spacer material is subsequently deposited over the mandrels 40, as shown in FIG. 1D. Spacers 60, i.e., the material extending or originally formed extending from sidewalls of another material, are then formed on the sides of the mandrels 40. The spacer formation is accomplished by preferentially etching the spacer material from the horizontal surfaces 70 and 80 in a directional spacer etch, as shown in FIG. 1E. The remaining mandrels 40 are then removed, leaving behind only the spacers 60, which together act as a mask for patterning, as shown in FIG. 1F. Thus, where a given pitch previously included a pattern defining one feature and one space, the same width now includes two features and two spaces, with the spaces defined by, e.g., the spacers 60. As a result, the smallest feature size possible with a photolithographic technique is effectively decreased.

While the pitch is actually halved in the example above, this reduction in pitch is conventionally referred to as pitch "doubling," or, more generally, pitch "multiplication." Thus, conventionally, "multiplication" of pitch by a certain factor actually involves reducing the pitch by that factor. The conventional terminology is retained herein.

As can be seen in FIG. 1E, the separation between the spacers 60 is partly dependent upon the distance between the mandrels 80. As a result, the pitch of the spacers 60 can still be limited by the resolution of photolithographic techniques typically used to define the mandrels 80. These resolution limits are an obstacle to further reductions in feature sizes.

Accordingly, there is a continuing need for methods to form ever smaller features on semiconductor substrates.

SUMMARY OF THE INVENTION

According to one aspect of the invention, a process is provided for semiconductor processing. The process comprises providing a plurality of mandrels on a level above a substrate. Spacers are formed on sidewalls of the mandrels. The mandrels and some of the spacers are removed and the substrate is processed through a mask pattern comprising features defined by a remainder of the spacers.

According to another aspect of the invention, a method is provided for semiconductor processing. The method comprises forming a first plurality of spacers by pitch multiplication on a first level and forming a second plurality of spacers by pitch multiplication on a second level above the first level.

According to yet another aspect of the invention, a method is provided for forming an integrated circuit. The method comprises forming a plurality of spacers of a first material. The spacers are covered by depositing a layer of a second material on the spacers. A thickness of the layer is less than a height of the spacers. A layer of a third material is deposited on the layer of the second material. Parts of the layer of the second material immediately adjacent the spacers are removed.

According to another aspect of the invention, a method is provided for processing semiconductor substrates. The method comprises forming a plurality of spacers by pitch multiplication on a level over a semiconductor substrate. A mask pattern is formed on a mask layer directly underlying the spacers by etching through a pattern defined by the plurality of spacers. The mask pattern comprises one or more mask features disposed between and separated from positions of immediately adjacent spacers.

According to yet another aspect of the invention, a method is provided for processing semiconductor substrates. The method comprises forming a plurality of mandrels over a semiconductor substrate. Spacer material is deposited around each of the mandrels. A position of one of the mandrels is measured. A position of spacer material around the one of the mandrels is also measured. The mandrels are removed to form a plurality of spacers. The spacers are trimmed to a desired critical dimension, with the duration of the trim chosen based upon the measured position of the one of the mandrels and the measured position of the spacer material.

According to another aspect of the invention, a method is provided for semiconductor processing. The method comprises providing a first set of mask features. A plurality of spacers is formed over features of the first set of mask features. The first set of mask features and the plurality of spacers are consolidated on the same level to form a mask pattern. The plurality of spacers define features in the mask pattern between features defined by the first set of mask features. A substrate is processed through the mask pattern.

According to yet another aspect of the invention, an integrated circuit is provided. The integrated circuit comprises a plurality of regularly spaced features in a region of the integrated circuit. The features have a critical dimension of about 50 nm or less and a spacing between the mask features is less than about 50 nm.

BRIEF DESCRIPTION OF THE DRAWINGS

The invention will be better understood from the Detailed Description of the Preferred Embodiments and from the appended drawings, which are meant to illustrate and not to limit the invention, and wherein:

FIG. 35 is a schematic, cross-sectional side view of the partially formed integrated circuit of FIG. 34 after transferring the pattern formed by the spacer material into the primary masking layer, in accordance with preferred embodiments of the invention.

DETAILED DESCRIPTION OF THE PREFERRED EMBODIMENTS

Figure 1A:
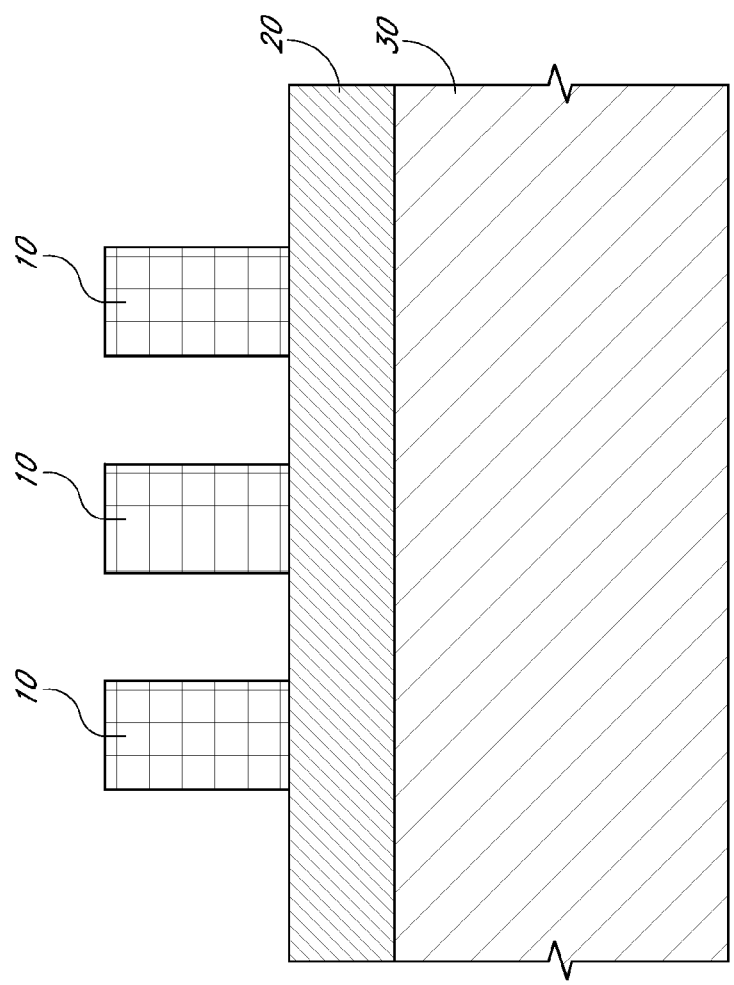
FIGS. 1A-1F are schematic, cross-sectional side views of a sequence of masking patterns for forming conductive lines, in accordance with a prior art pitch doubling method.
Figure 1B:
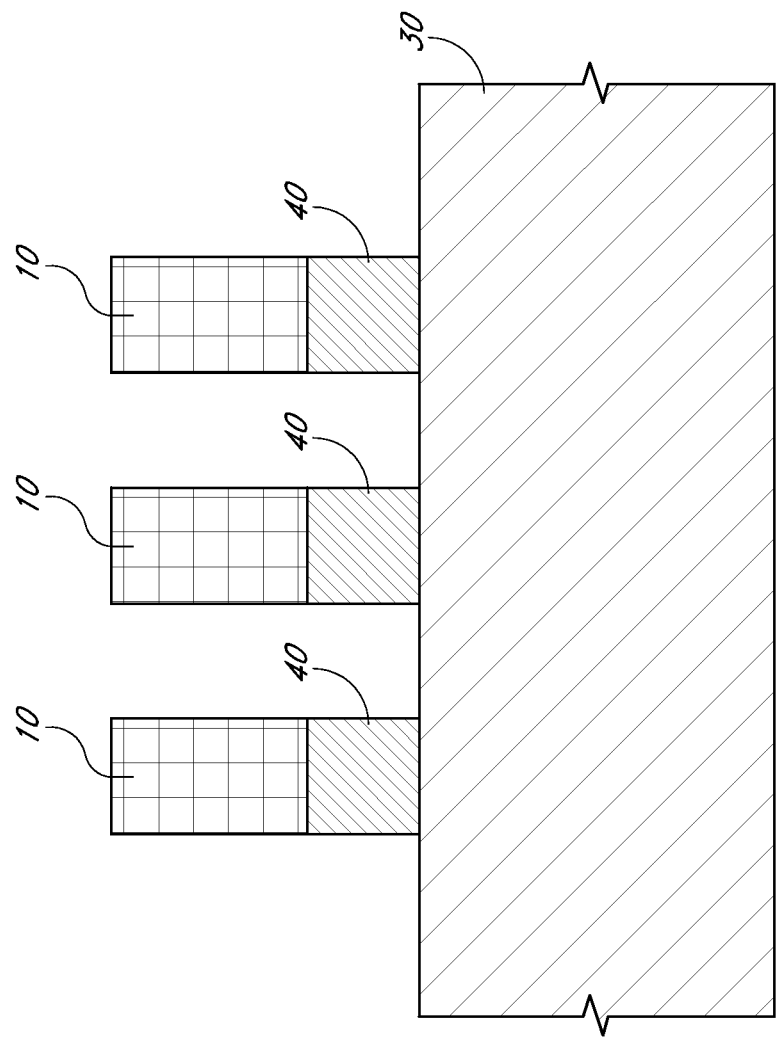
Figure 1C:
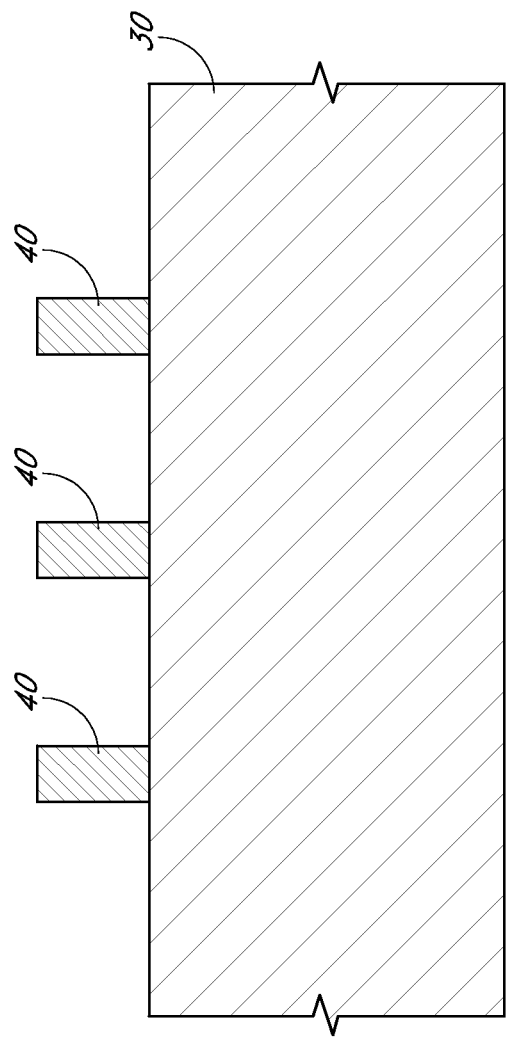
Figure 1D:
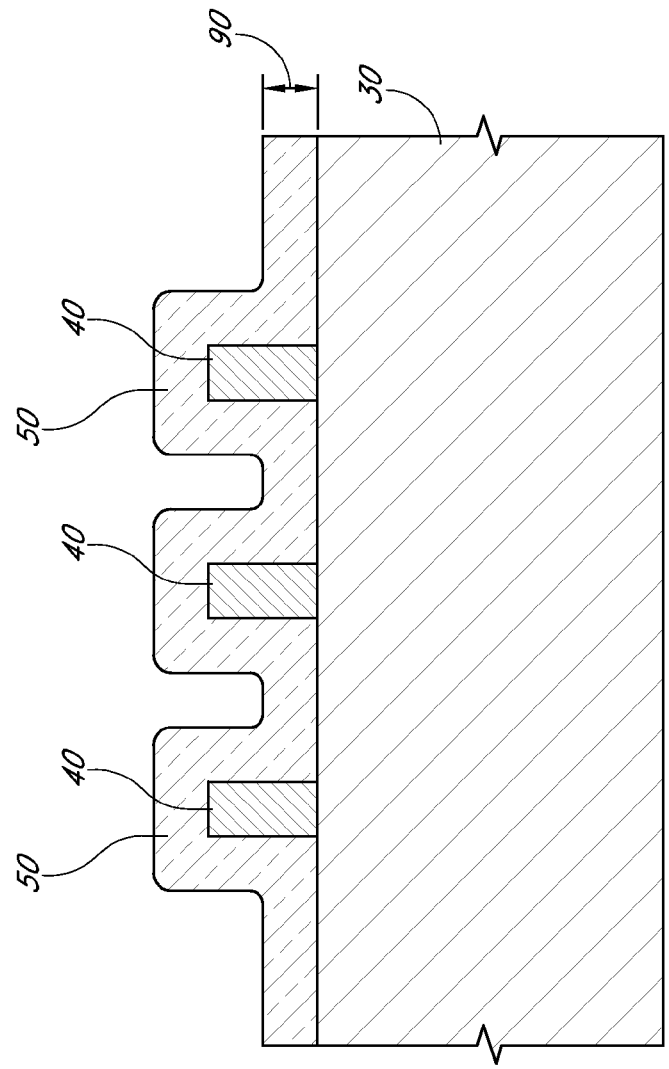
Figure 1E:
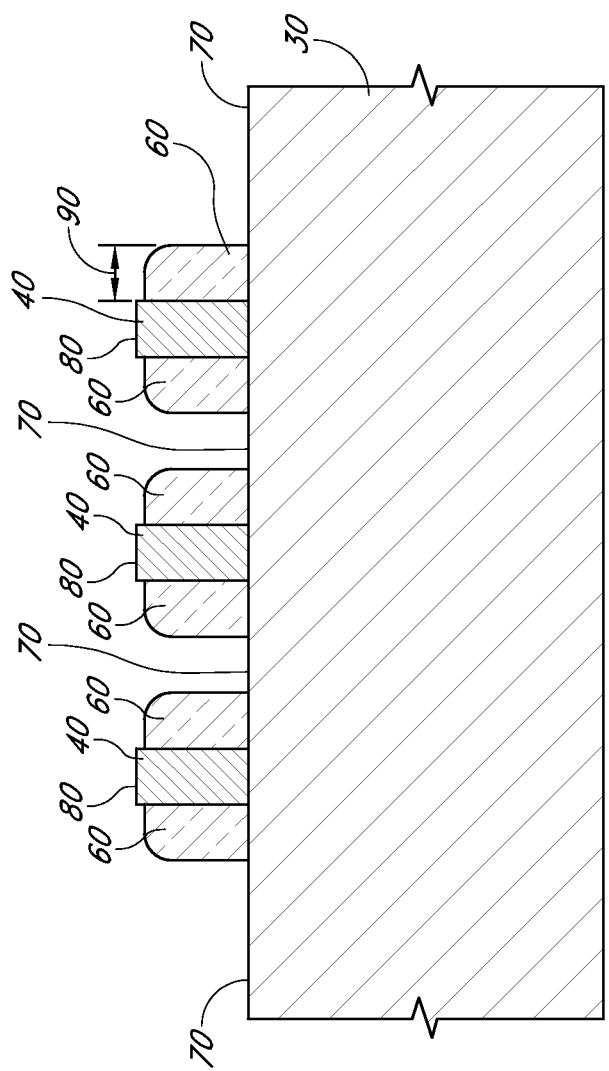
Figure 1F:
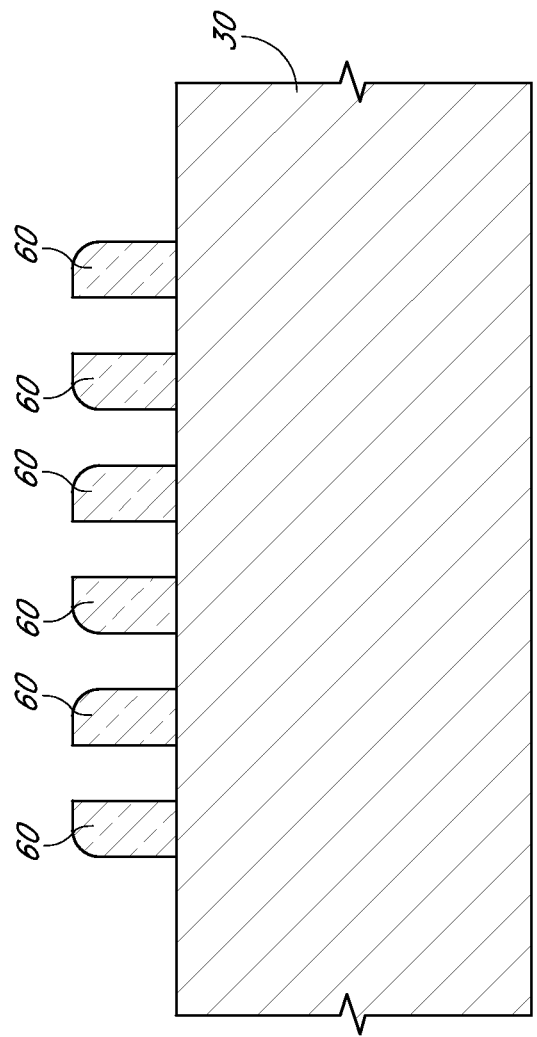

In preferred embodiments of the invention, in a masking process for reducing feature sizes, the distance between features in a mask pattern is decoupled from the formation of that particular feature. For example, the distance between spacers is decoupled from the width of the mandrels used to form the spacers. Advantageously, exceptionally closely spaced mask features or mask features can be formed.

In some preferred embodiments, mask features, such as spacers, are formed on a first level and additional mask features are formed on one or more higher levels in the lateral space between the features on the first level. All the mask features are then consolidated on a single level above a substrate, which can be patterned using the consolidated mask features.

For example, in preferred embodiments, spacers are formed at the sidewalls of mandrels on a first level. The mandrels and a plurality of spacers, preferably one of each pair of spacers formed around a mandrel, are removed, leaving a pattern of "single spacers" that have a pitch substantially equal to the pitch of the mandrels. A temporary layer is then formed around the spacers.

On a second level over these spacers, mandrels are formed and spacers are formed around the mandrels. The mandrels and a plurality of spacers, preferably every other spacer, on the second level are removed to form another pattern of single spacers over the pattern of spacers on the first level. These cycles of spacer formation and mandrel and spacer removal can be repeated on successively higher levels, as desired. For example, these cycles can be terminated before newly formed single spacers overlap regions of previously formed spacers.

Advantageously, the lateral separation between spacers is based partly on photo-overlay capabilities and the ability to form mandrels and spacers at desired positions. Because photo-overlay capabilities can be better than the resolutions of the techniques used to pattern the mandrels, the distance between spacers can be reduced in comparison to using photolithographically defined mandrels to determine the spacing between spacers. Moreover, because spacers on successively higher levels are formed independent of spacers on lower levels, the spacers on the higher levels can be independently trimmed as necessary to more accurately achieve a desired critical dimension and/or spacing.

In other preferred embodiments, the spacing between the single spacers is determined by depositing layers of a second material around the spacers. Preferably, the second material is selectively etchable relative to the material forming the spacers. Vertically extending layers of spacer material (or other material with similar etch selectivity) and material(s) selectively etchable relative to the spacers are alternatingly deposited. These layers are then exposed and etched, leaving behind, e.g., only features protected by the vertically extending spacer material. Advantageously, the spacing between the spacer material is determined by the thickness of the layers of the other material(s). This thickness can be precisely controlled by controlling the deposition of the material, thereby allowing good control of the spacing of the spacer material.

Reference will now be made to the Figures, wherein like numerals refer to like parts throughout. It will be appreciated that the Figures are not necessarily drawn to scale.

Initially, a sequence of layers of materials is formed to allow formation of the spacers on a first level over a substrate.

Figure 2:
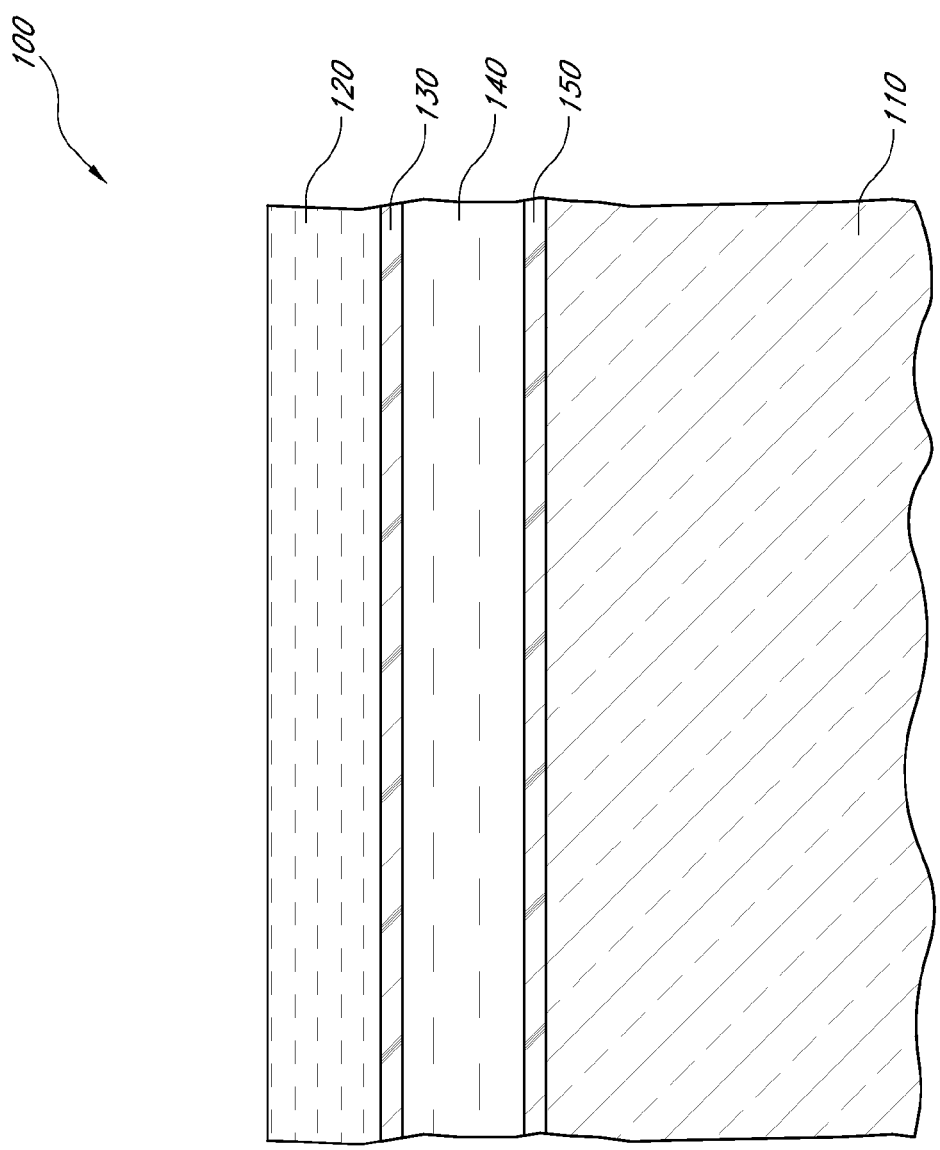
FIG. 2 is a schematic cross-sectional side view of a partially formed integrated circuit, in accordance with preferred embodiments of the invention.

FIG. 2 shows a cross-sectional side view of a partially formed integrated circuit 100. While the preferred embodiments can be used to form any integrated circuit, they are particularly advantageously applied to form devices having arrays of electrical devices, including memory cell arrays for volatile and non-volatile memory devices such as DRAM, ROM or flash memory, including NAND flash memory. Consequently, the integrated circuit 100 can preferably be a memory chip or a logic or processor with embedded memory or a gate array.

With continued reference to FIG. 2, various masking layers 120-150 are preferably provided above a substrate 110. The layers 120-150 will be etched to form a mask for patterning the substrate 110, as discussed below. The materials for the layers 120-150 overlying the substrate 110 are preferably chosen based upon consideration of the chemistry and process conditions for the various pattern forming and pattern transferring steps discussed herein. Because the layers between a topmost selectively definable layer 120 and the substrate 110 preferably function to transfer a pattern derived from the selectively definable layer 120 to the substrate 110, the layers 130-150 between the selectively definable layer 120 and the substrate 110 are preferably chosen so that they can be selectively etched relative to other exposed materials. It will be appreciated that a material is considered selectively, or preferentially, etched when the etch rate for that material is at least about 5 times greater, preferably at least about 10 times greater, more preferably at least about 20 times greater and, most preferably, at least about 40 times greater than that for surrounding materials. Because a goal of the layers 120-150 overlying the substrate 110 is to allow well-defined patterns to be formed in that substrate 110, it will be appreciated that one or more of the layers 120-150 can be omitted or substituted if suitable other materials, chemistries and/or process conditions are used. For example, the layer 130 can be omitted in some embodiments where the resolution enhancement properties of that layer, as discussed below, are not desired. In other embodiments, discussed further below, additional masking layers can be added between the layer 150 and the substrate 110 to form a mask having improved etch selectivity relative to the substrate 110. Exemplary materials for the various layers discussed herein include silicon oxide, silicon nitride, silicon, amorphous carbon, dielectric antireflective coatings (DARC, silicon rich silicon oxynitride), and organic bottom antireflective coatings (BARC), each of which can be selectively etched relative to at least 2 or 3 of the other materials, depending upon the application.

In addition to selecting appropriate materials for the various layers, the thicknesses of the layers 120-150 are preferably chosen depending upon compatibility with the etch chemistries and process conditions described herein. For example, when transferring a pattern from an overlying layer to an underlying layer by selectively etching the underlying layer, materials from both layers are removed to some degree. Preferably, the upper layer is thick enough so that it is not worn away over the course of the pattern transfer.

The selectively definable layer 120 overlies a first hard mask, or etch stop, layer 130, which overlies a temporary layer 140, which overlies a second hard mask, or etch stop, layer 150, which overlies the substrate 110 to be processed (e.g., etched) through a mask. The selectively definable layer 120 is preferably photodefinable, e.g., formed of a photoresist, including any photoresist known in the art. For example, the photoresist can be any photoresist compatible with 157 nm, 193 nm, 248 nm or 365 nm wavelength systems, 193 nm wavelength immersion systems, extreme ultraviolet systems (including 13.7 nm systems) or electron beam lithographic systems. Examples of preferred photoresist materials include argon fluoride (ArF) sensitive photoresist, i.e., photoresist suitable for use with an ArF light source, and krypton fluoride (KrF) sensitive photoresist, i.e., photoresist suitable for use with a KrF light source. ArF photoresists are preferably used with photolithography systems utilizing relatively short wavelength light, e.g., 193 nm. KrF photoresists are preferably used with longer wavelength photolithography systems, such as 248 nm systems. In other embodiments, the layer 120 and any subsequent resist layers can be formed of a resist that can be patterned by nano-imprint lithography, e.g., by using a mold or mechanical force to pattern the resist.

The material for the first hard mask layer 130 preferably comprises an inorganic material. Exemplary materials include silicon oxide ($SiO_2$), silicon or a dielectric anti-reflective coating (DARC), such as a silicon-rich silicon oxynitride. Preferably, the first hard mask layer 130 is a dielectric anti-reflective coating (DARC). Using DARCs for the first hard mask layer 130 can be particularly advantageous for forming patterns having pitches near the resolution limits of a photolithographic technique. The DARCs can enhance resolution by minimizing light reflections, thus increasing the precision with which photolithography can define the edges of a pattern.

The temporary layer 140 is preferably formed of amorphous carbon, which, as noted above, offers very high etch selectivity relative to the preferred hard mask materials. More preferably, the amorphous carbon is a form of amorphous carbon that is highly transparent to light and that offers further improvements for photo alignment by being transparent to the wavelengths of light used for such alignment. Deposition techniques for forming such transparent carbon can be found in A. Helmbold, D. Meissner, Thin Solid Films, 283 (1996) 196-203, the entire disclosure of which is incorporated herein by reference.

The material for the second hard mask layer 150 is preferably chosen based upon the material used for the spacers and for the underlying substrate 110. Where the spacer material is an oxide, the second hard mask layer 150 preferably comprises a dielectric anti-reflective coating (DARC) (e.g., a silicon oxynitride), silicon or aluminum oxide ($Al_2O_3$). In addition, a bottom anti-reflective coating (BARC) (not shown) can optionally be used to control light reflections. In the illustrated embodiment, the second hard mask layer 150 comprises amorphous silicon. In other cases, where the substrate 110 comprises silicon, the second hard mask layer 150 can be any material, e.g., $Al_2O_3$, preferably having good etch selectivity relative to silicon.

The various layers discussed herein can be formed by various methods known in the art. For example, spin-on-coating processes can be used to form photodefinable layers, BARC, and spin-on dielectric oxide layers. Various vapor deposition processes, such as chemical vapor deposition, can be used to form hard mask layers.

Figure 3:
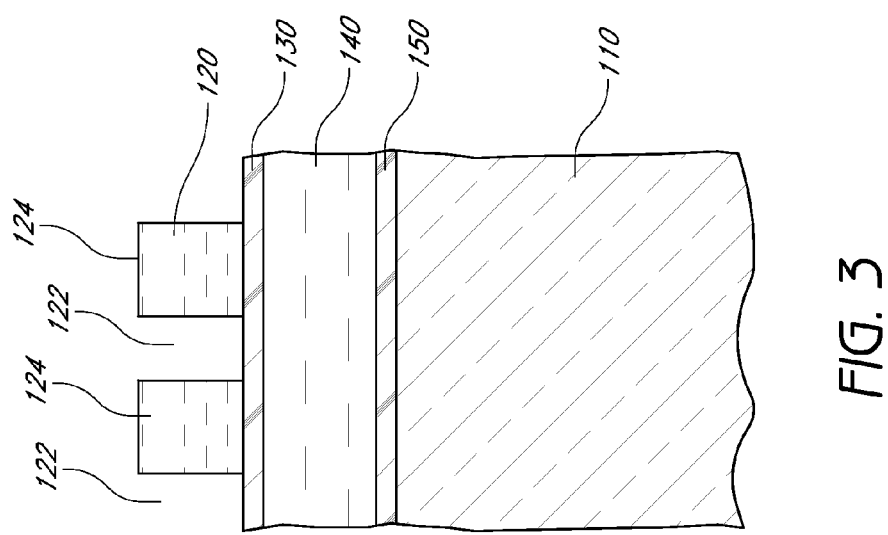
FIG. 3 is a schematic cross-sectional side view of the partially formed integrated circuit of FIG. 2 after forming lines in a photoresist layer, in accordance with preferred embodiments of the invention.

Next, a pattern of spacers is formed by pitch multiplication. With reference to FIG. 3, a pattern comprising spaces or trenches 122, which are delimited by photodefinable material features 124, is formed in the photodefinable layer 120. The trenches 122 can be formed by, e.g., photolithography with 248 nm or 193 nm light, in which the layer 120 is exposed to radiation through a reticle and then developed. After being developed, the remaining photodefined material forms mask features such as the illustrated lines 124 (shown in cross-section only).

Figure 4:
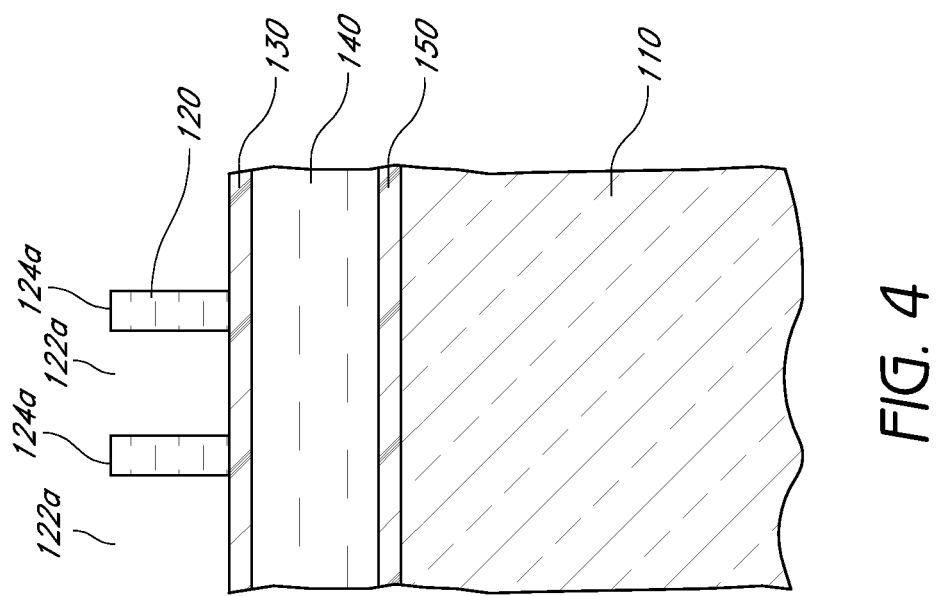
FIG. 4 is a schematic cross-sectional side view of the partially formed integrated circuit of FIG. 3 after widening spaces between lines in the photoresist layer, in accordance with preferred embodiments of the invention.

As shown in FIG. 4, the photoresist lines 124 can be etched using an isotropic etch to "shrink" those features to adjust their widths. The extent of the etch is preferably selected so that the widths of the modified lines 124a are substantially equal to the desired spacing between the later-formed spacers 175 (FIG. 9), as will be appreciated from the discussion below. Suitable etches include etches using an oxygen-containing plasma, e.g., a $SO_2/O_2/N_2/Ar$ plasma, a $Cl_2/O_2/He$ plasma or a $HBr/O_2/N_2$ plasma. For example, the width of the lines 124 can be reduced from about 80-120 nm to about 40-70 nm. Advantageously, the width-reducing etch allows the lines 124a to be narrower than would otherwise be possible using the photolithographic technique used to pattern the photodefinable layer 120. In addition, the etch can smooth the edges of the lines 124a, thus improving the uniformity of those lines. While the critical dimensions of the lines 124a can be etched below the resolution limits of the photolithographic technique, it will be appreciated that this etch does not alter the pitch of the spaces 122a and lines 124a, since the distance between identical points in these features remains the same.

Figure 5:
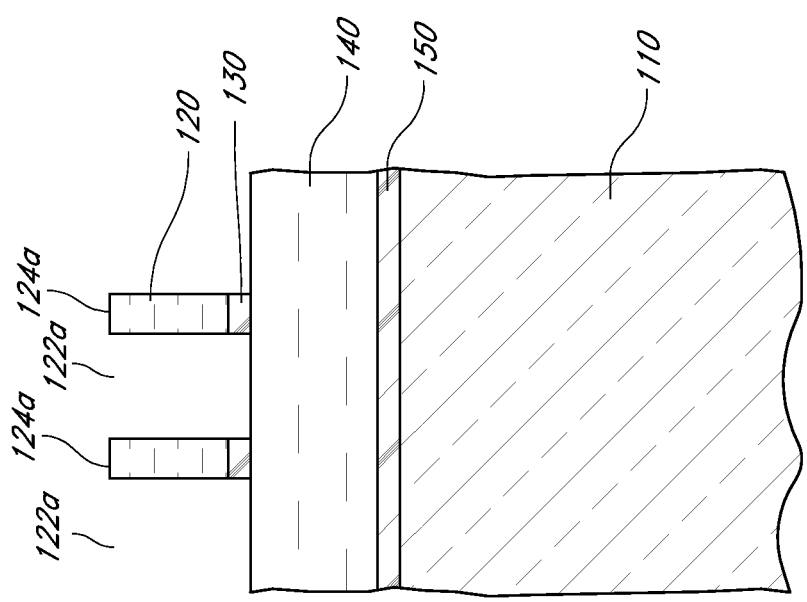
FIG. 5 is a schematic, cross-sectional side view of the partially formed integrated circuit of FIG. 4 after etching through a first hard mask layer, in accordance with preferred embodiments of the invention.

With reference to FIG. 5, the pattern in the (modified) photodefinable layer 120a is transferred to the hard mask layer 130. This transfer is preferably accomplished using an anisotropic etch, such as an etch using a fluorocarbon plasma, although a wet (isotropic) etch may also be suitable if the hard mask layer 130 is thin. Preferred fluorocarbon plasma etch chemistries include $CFH_3$, $CF_2H_2$ and $CF_3H$.

Figure 6:
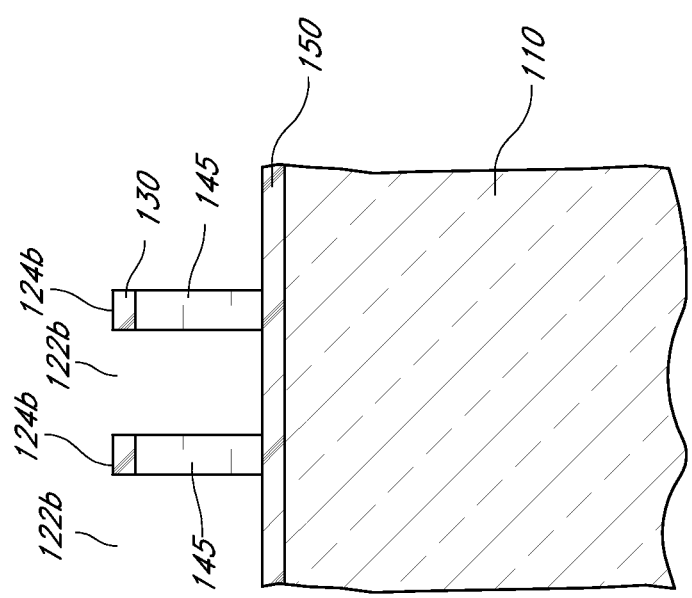
FIG. 6 is a schematic, cross-sectional side view of the partially formed integrated circuit of FIG. 5 after transferring a pattern from the hard mask layer to a temporary layer to form a pattern of mandrels in the temporary layer, on a first level, in accordance with preferred embodiments of the invention.

With reference to FIG. 6, the pattern in the photodefinable layer 120a and the hard mask layer 130 is transferred to the temporary layer 140 to form mandrels 145. A layer 170 of spacer material (FIG. 8) will later be deposited on the mandrels 145. It has been found that the temperatures used for spacer material deposition (which is preferably conformal, such that chemical vapor deposition or atomic layer deposition are preferred) are typically too high for photoresist to withstand. Thus, the pattern is preferably transferred from the photodefinable layer 120a to the temporary layer 140, which is formed of a material that can withstand the process conditions for spacer material deposition and etching, discussed below. In addition to having higher heat resistance than photoresist, the material forming the temporary layer 140 is preferably selected such that it can be selectively removed relative to the material for the spacers 175 (FIG. 9) and the underlying etch stop layer 150. As noted above, the layer 140 is preferably formed of amorphous carbon and, more preferably, transparent carbon.

The pattern in the modified photodefinable layer 120a is preferably transferred to the temporary layer 140 using a $O_2$-containing plasma, e.g., a plasma containing $SO_2$, $O_2$ and Ar. Other suitable etch chemistries include a $Cl_2/O_2/SiCl_4$ or $SiCl_4/O_2/N_2$ or $HBr/O_2/N_2/SiCl_4$ containing plasma. Advantageously, the $SO_2$-containing plasma is used as it can etch carbon of the preferred temporary layer 140 at a rate greater than 20 times and, more preferably, greater than 40 times the rate that the hard mask layer 130 is etched. A suitable $SO_2$-containing plasma is described in U.S. patent application Ser. No. 10/931,772 to Abatchev et al., filed Aug. 31, 2004, the entire disclosure of which is incorporate herein by reference. It will be appreciated that the $SO_2$-containing plasma can simultaneously etch the temporary layer 140 and also remove the photoresist layer 120a. The resulting lines 124b, separated by spaces 122b, constitute the placeholders or mandrels along which a pattern of spacers 175 (FIG. 9) will be formed.

Figure 7:
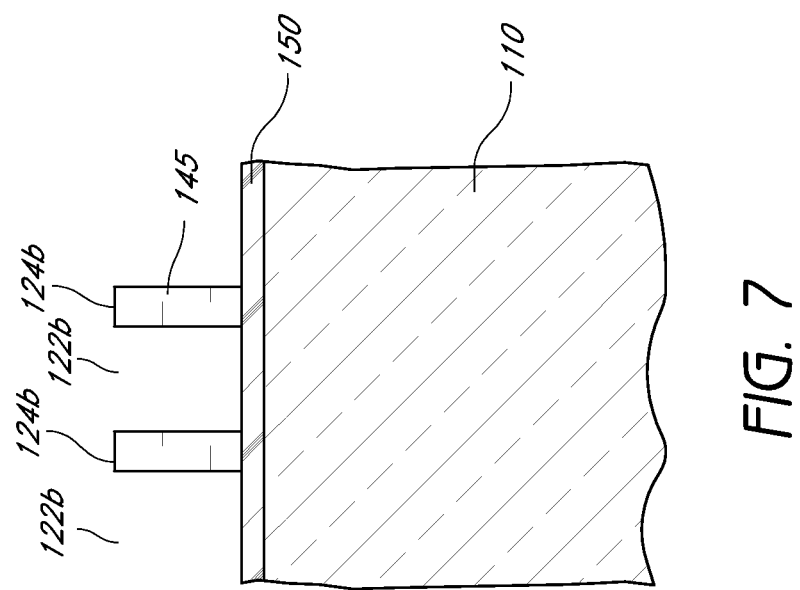
FIG. 7 is a schematic, cross-sectional side view of the partially formed integrated circuit of FIG. 6 after a hard mask layer removal, in accordance with preferred embodiments of the invention.
Figure 12:
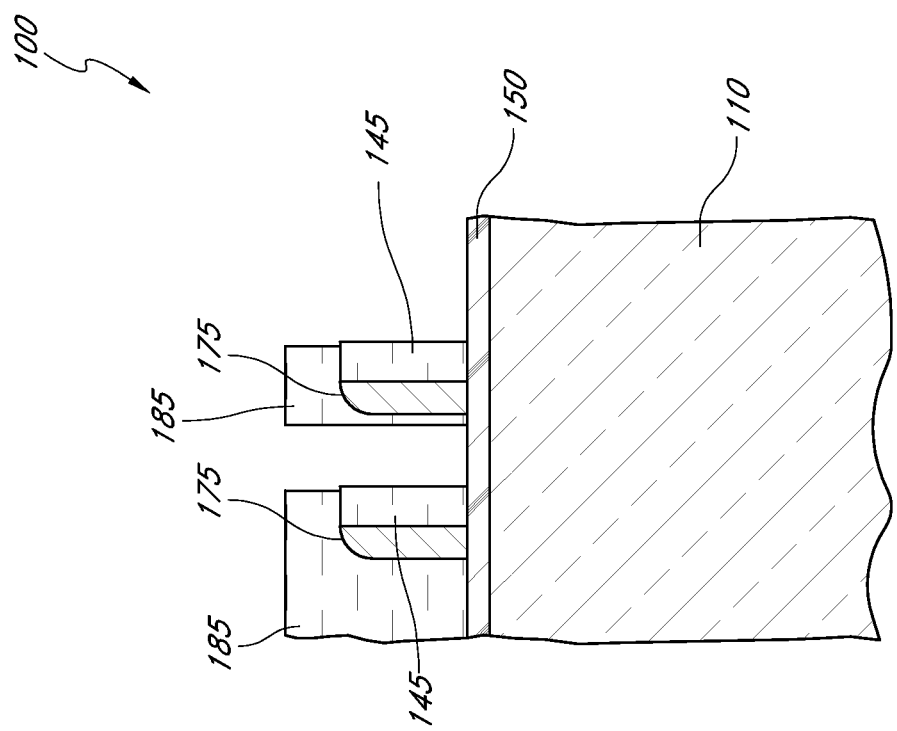
FIG. 12 is a schematic, cross-sectional side view of the partially formed integrated circuit of FIG. 11 after a removal of selected spacers, in accordance with preferred embodiments of the invention.

With reference to FIG. 7, the hard mask layer 130 can be selectively removed to facilitate later spacer formation by leaving the mandrels 145 exposed for subsequent etching (FIG. 12). The hard mask layer 130 can be removed using a buffered oxide etch (BOE), which is a wet etch comprising HF and $NH_4F$.

Figure 8:
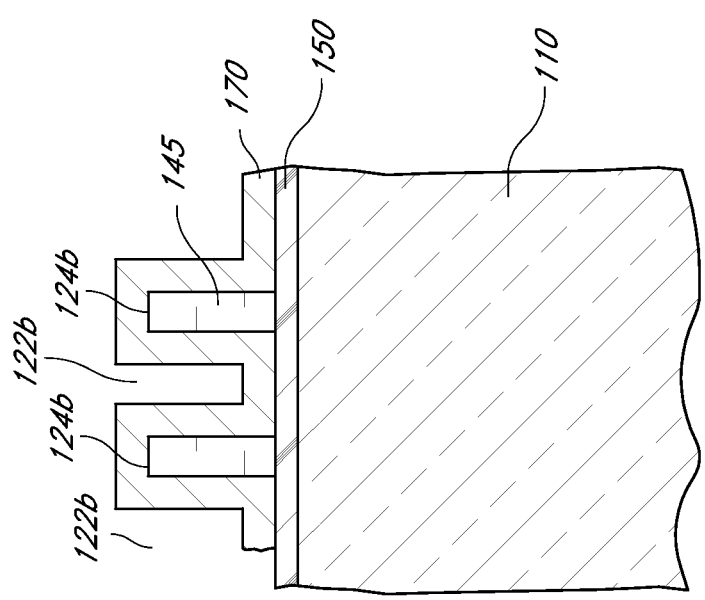
FIG. 8 is a schematic, cross-sectional side view of the partially formed integrated circuit of FIG. 7 after depositing a layer of a spacer material, in accordance with preferred embodiments of the invention.

Next, as shown in FIG. 8, a layer 170 of spacer material is preferably blanket deposited conformally over exposed surfaces, including the hard mask layer 150 and the tops and sidewalls of the mandrels 145. The spacer material can be any material that can act as a mask for transferring a pattern to the underlying hard mask layer 150. The spacer material preferably: 1) can be deposited with good step coverage; 2) can be deposited at a temperature compatible with the mandrels 145; and 3) can be selectively etched relative to the mandrels 145 and underlying hard mask layer 150. Preferred materials include silicon, silicon oxides and silicon nitrides. In the illustrated embodiment, the spacer material is silicon oxide, which provides particular advantages in combination with other selected materials of the masking stack.

Figure 9:
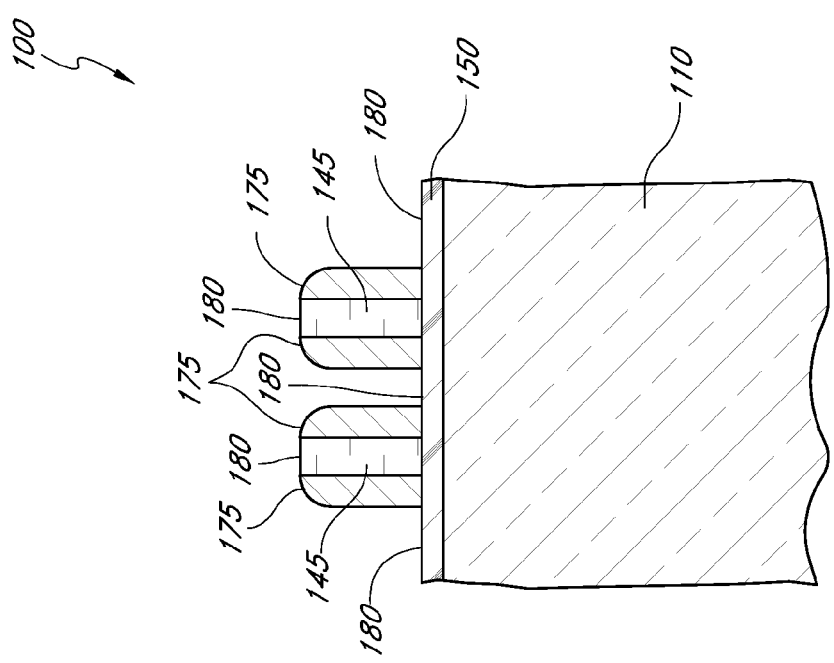
FIG. 9 is a schematic, cross-sectional side view of the partially formed integrated circuit of FIG. 8 after a spacer etch, in accordance with preferred embodiments of the invention.

Preferred methods for spacer material deposition include chemical vapor deposition, e.g., using $O_3$ and TEOS to form silicon oxide, and atomic layer deposition (ALD), e.g., using a self-limitingly deposited silicon precursor and an oxygen precursor to form silicon oxide. The thickness of the layer 170 is preferably determined based upon the desired width of the spacers 175 (FIG. 9). Preferably, the step coverage is about 80% or greater and, more preferably, about 90% or greater.

With reference to FIG. 9, the silicon oxide spacer layer 170 is then subjected to an anisotropic etch to remove spacer material from horizontal surfaces 180 of the partially formed integrated circuit 100. Such a directional etch, also known as a spacer etch, can be performed using a fluorocarbon plasma, e.g., containing $CF_4/CHF_3$, $C_4F_8/CH_2F_2$ or $CHF_3/Ar$ plasma. While shown for ease of illustration having approximately the same width as the mandrels 145, the spacers 175 can have a smaller width than the mandrels 145.

Figure 10:
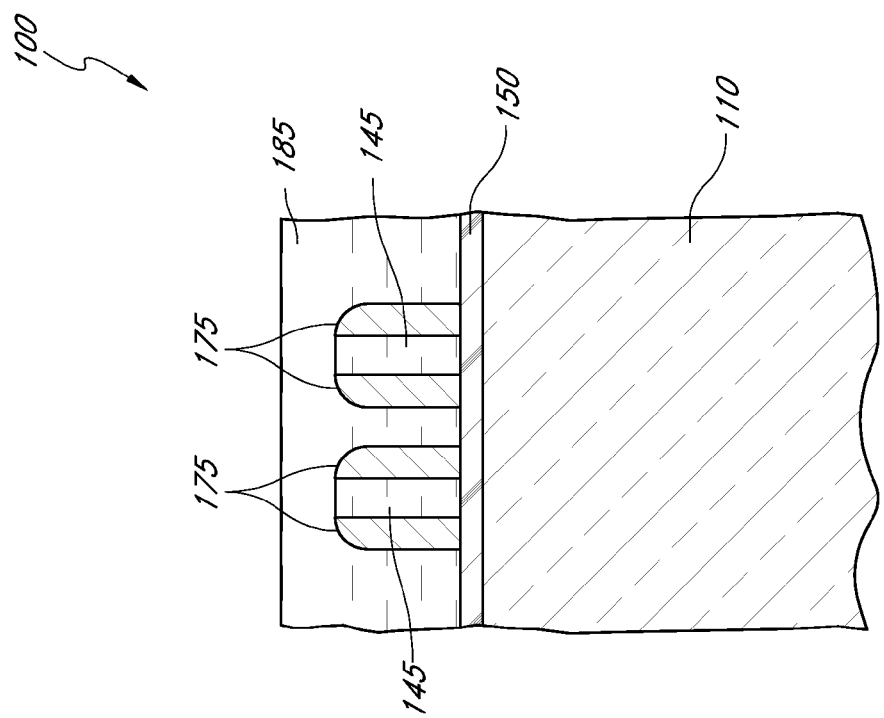
FIG. 10 is a schematic, cross-sectional side view of the partially formed integrated circuit of FIG. 9 after forming a protective layer over and around the spacers and mandrels, in accordance with preferred embodiments of the invention.

Next, some of the spacers 175, and preferably every other spacer 175, is removed. With reference to FIG. 10, a protective material 185 is deposited around and over the spacers 175 and the mandrels 145. The protective material 185 is preferably a photodefinable material such as photoresist. Optionally, an anti-reflective coating (not shown) can be provided under the layer 185 to improve photolithography results. The photoresist and the anti-reflective coating can be deposited using various methods known in the art, including spin-on-coating processes.

Figure 11:
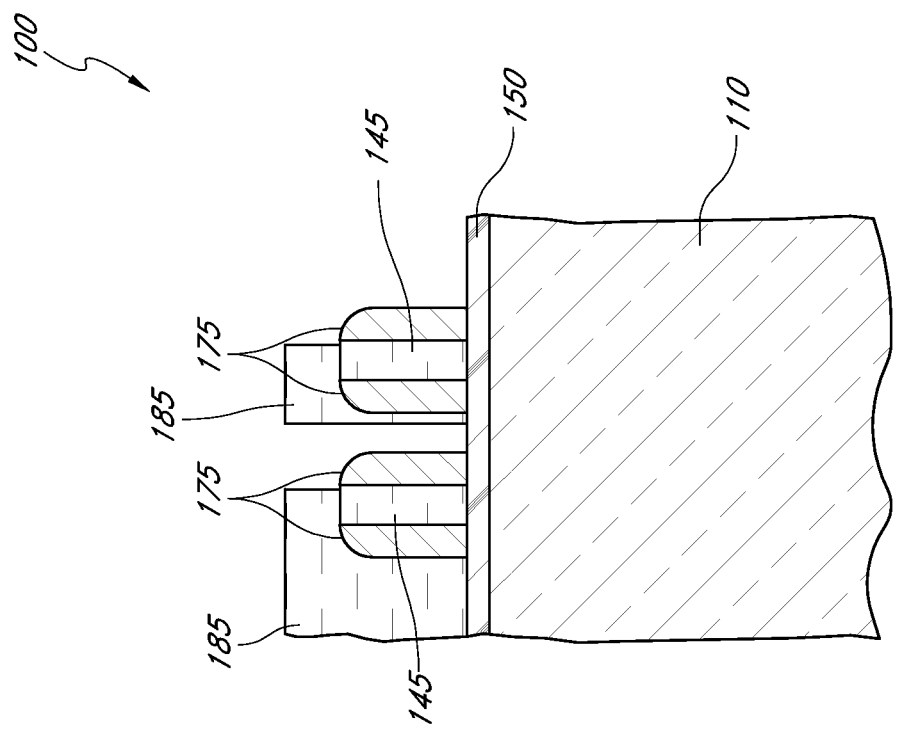
FIG. 11 is a schematic, cross-sectional side view of the partially formed integrated circuit of FIG. 10 after patterning the protective layer, in accordance with preferred embodiments of the invention.

With reference to FIG. 11, the protective layer 185 is patterned, e.g., by photolithography, to protect desired spacers 175 from a subsequent spacer removal step. In the illustrated embodiment, one of each pair of spacers 175 formed around a mandrel 145 is left exposed for removal.

With reference to FIG. 12, the exposed spacers 175 are etched away. Where the spacers 175 comprise silicon oxide, preferred etch chemistries include a fluorocarbon etch or the spacers 175 can be etched using a wet chemistry, e.g., a buffered oxide etch. It will be appreciated that spacers 175 may be removed in some regions of the integrated circuit 100, but are not removed in other regions, depending upon the desired pattern etched into the protective layer 185.

Figure 13:
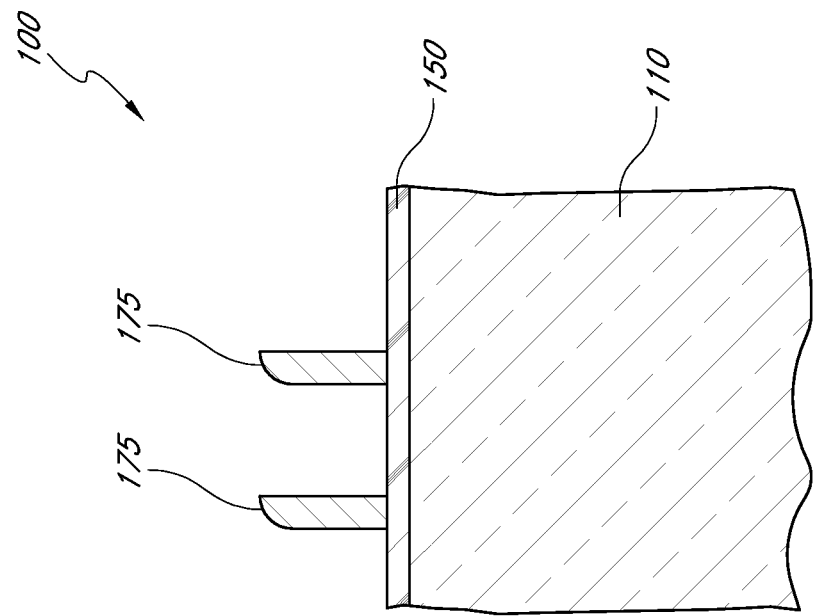
FIG. 13 is a schematic, cross-sectional side view of the partially formed integrated circuit of FIG. 12 after removing the protective layer and the mandrels, in accordance with preferred embodiments of the invention.

With reference to FIG. 13, the protective layer 185 and the mandrels 145 are preferably selectively removed. Where the material forming the protective layer 185 is an organic material such as photoresist or BARC, preferred etch chemistries include anisotropic etches, such as with a $SO_2$-containing plasma. Advantageously, these chemistries can also remove the mandrels 145, which are formed of carbon in the illustrated embodiment. The partially formed integrated circuit 100 can also be subjected to an ash process to remove the protective layer 185 and the mandrels 145. It will be appreciated that the protected spacers 175 are not attacked during this removal step and that the substrate 110 is protected by the second hard mask layer 150. Thus, a pattern of "single spacers" 175 are formed on a first level over the substrate 110.

It will be appreciated that the spacers 175 are spaced sufficiently far apart to accommodate other mask features in the space between the spacers 175. In the illustrated embodiment, if the width of the spacers 175 is considered to be ½ F, the separation between spacers 175 is about 7/4 F.

Figure 14A:
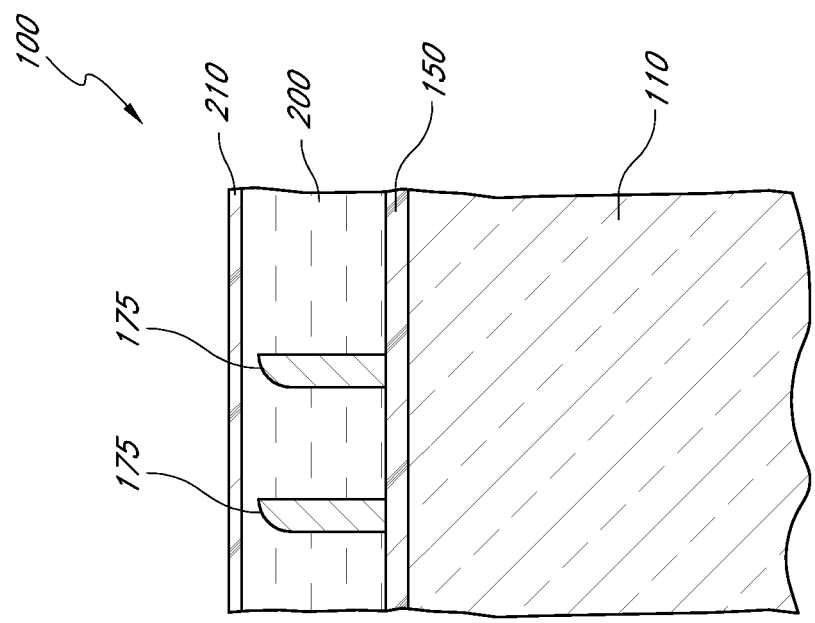
FIG. 14A is a schematic, cross-sectional side view of the partially formed integrated circuit of FIG. 13 after depositing a planarizing layer and a hard mask layer, respectively, over the mandrels, in accordance with preferred embodiments of the invention.

A sequence of layers is then deposited to allow formation of additional spacers in the space between the spacers 175 on a second level over the spacers 175 and the substrate 110. With reference to FIG. 14A, a planarizing layer 200 is deposited around the single spacers 175 and a hard mask layer 210 is deposited over the second temporary layer 200. If necessary, the layer 200 can be planarized by, e.g., chemical mechanical polishing (CMP) before forming the hard mask layer 210. Typically, if the material is a spin-on material (e.g., resist, SOD, BARC), CMP is not necessary.

The planarizing layer 200 is preferably formed of a material selectively etchable relative to both the spacers 175 and the layer 150. The hard mask layer 210 is preferably formed of a material selectively etchable relative to the planarizing layer 200. For example, the planarizing layer 200 can be formed of amorphous carbon, while the hard mask layer 210 can be formed of a DARC or amorphous silicon.

Figure 14B:
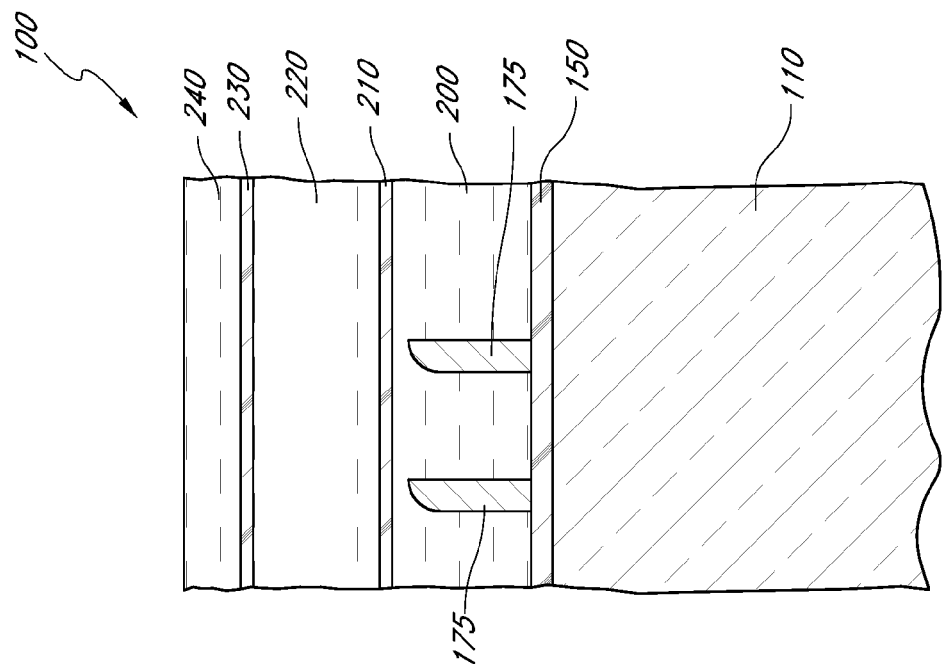
FIG. 14B is a schematic, cross-sectional side view of the partially formed integrated circuit of FIG. 14A after depositing a second temporary layer, a hard mask layer and a photodefinable layer, respectively, in accordance with preferred embodiments of the invention.

With reference to FIG. 14B, a sequence of layers 220-240 can be deposited to allow formation of additional spacers over the hard mask layer 210. For example, as discussed above with reference to FIG. 2, the second temporary layer 220 can comprise amorphous carbon, the hard mask layer 230 can comprise silicon oxide ($SiO_2$), silicon or a DARC, and the photodefinable layer 240 can comprise a photoresist.

Figure 15:
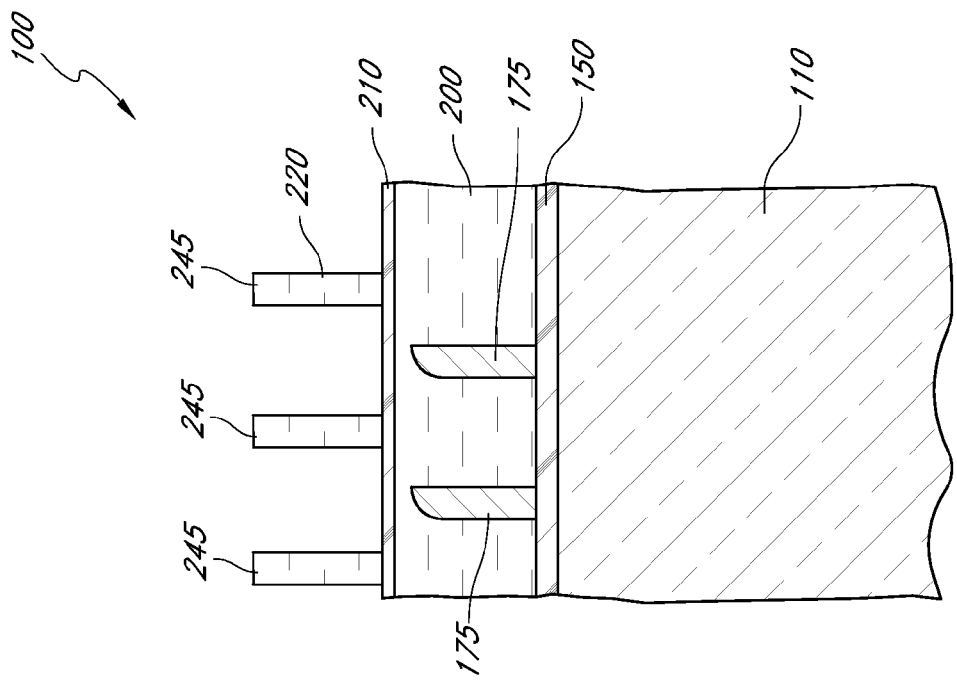
FIG. 15 is a schematic, cross-sectional side view of the partially formed integrated circuit of FIG. 14B after forming a pattern of mandrels in the second temporary layer, on a second level, in accordance with preferred embodiments of the invention.
Figure 16:
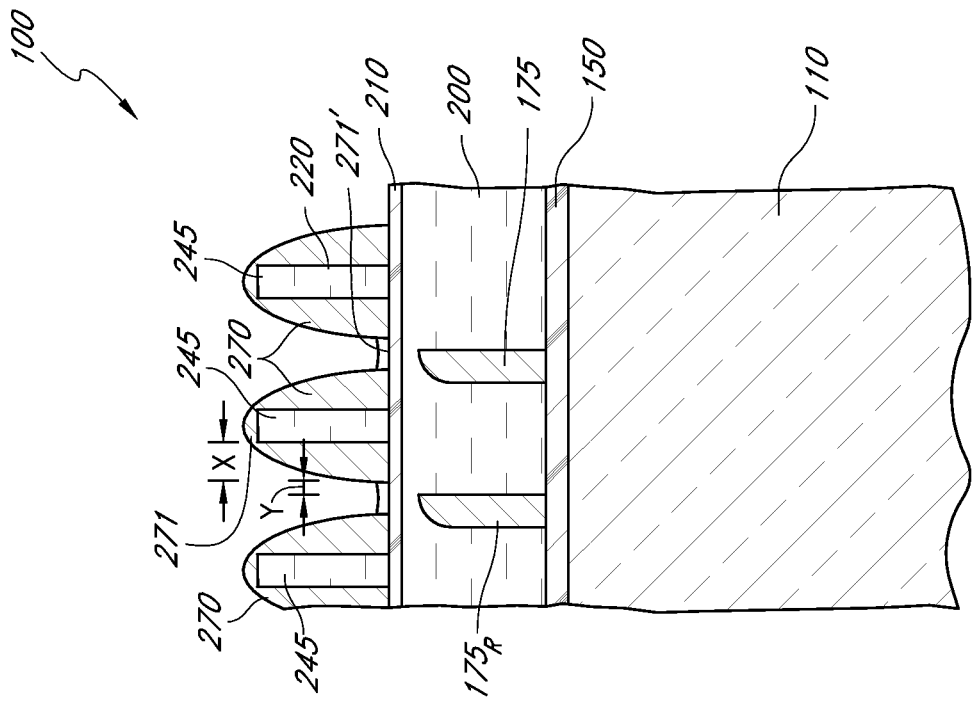
FIG. 16 is a schematic, cross-sectional side view of the partially formed integrated circuit of FIG. 15 after depositing a spacer material around the mandrels and conducting an incomplete spacer etch, in accordance with preferred embodiments of the invention.

Preferably, applying again the steps discussed above with reference to FIGS. 2-7, a pattern of mandrels 245 are formed in the layer 220, as shown in FIG. 15. With reference to FIG. 16, spacer material 270 is deposited around the mandrels 245. As noted above, the spacer material 270 can be any material having deposition and etch properties compatible with the other materials used herein. Depending on the identity of the spacer material 270, the spacer material 270 may be deposited by atomic layer deposition, as discussed above.

In the illustrated embodiment, the spacer material 270 is silicon oxide and is deposited by chemical vapor deposition using $O_3$ and TEOS. A suitable deposition system is Applied Materials' Producer® HARP™ system. After the deposition, the spacer material 270 may extend over the surface of the hardmask layer 210 between two mandrels 245. Where this occurs, the spacer material 270 can be subjected to an optionally incomplete spacer etch, leaving only a thin spacer material layer 271 over the mandrels 245 and the hard mask layer 210. In other embodiments, the spacer material layer 271 can be completely absent. FIG. 16 shows the spacer material 270 after an incomplete spacer etch.

With continued reference to FIG. 16, the width of the deposited spacer material 270 is preferably chosen to exceed the desired width of the spacer 275 (FIG. 19) that will be formed from the spacer material 270. The excess width at this point can be provided by excess deposition and/or an incomplete spacer etch. This excess spacer width allows a margin for the width and position of the resulting spacers 275 to be fine-tuned by trim etching, thereby increasing the uniformity of the spacers 275 and the precision with which the spacers 275 are placed.

It will be appreciated that due to various factors, including errors in photo-alignment and the resolution of photolithography methods, the mandrels 245 may be misaligned by a particular margin. This misalignment can cause misalignments in the ultimately formed spacers 275 (FIG. 19) relative to their desired positions. Consequently, the mandrels 245 are preferably positioned and sized so that the spacer material 270 extends over an area greater than the desired position of the spacers 275. The position of spacer material 270 can then be measured and etched, as necessary, to form spacers 275 having the desired critical dimensions and positioning.

With continued reference to FIG. 16, the mandrel 245 is laterally spaced from a reference point, the spacer $175_R$, by a lateral distance X (as measured from the edge of the mandrel 245 closest to the spacer $175_R$). Similarly, the spacer material 270 is laterally spaced from the spacer $175_R$ by a lateral distance Y (as measured from the edge of the spacer material 270 closest to the spacer $175_R$). These positions are measured using metrology tools, as known in the art. The width of the spacer material 270 is X−Y.

Figure 17:
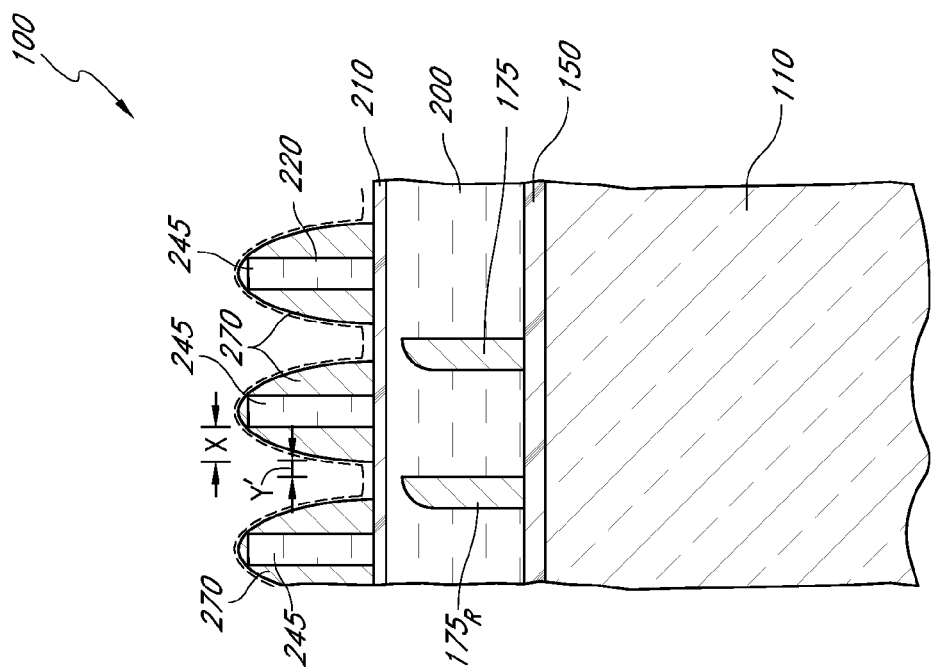
FIG. 17 is a schematic, cross-sectional side view of the partially formed integrated circuit of FIG. 16 after trimming the spacer material, in accordance with preferred embodiments of the invention.
Figure 19:
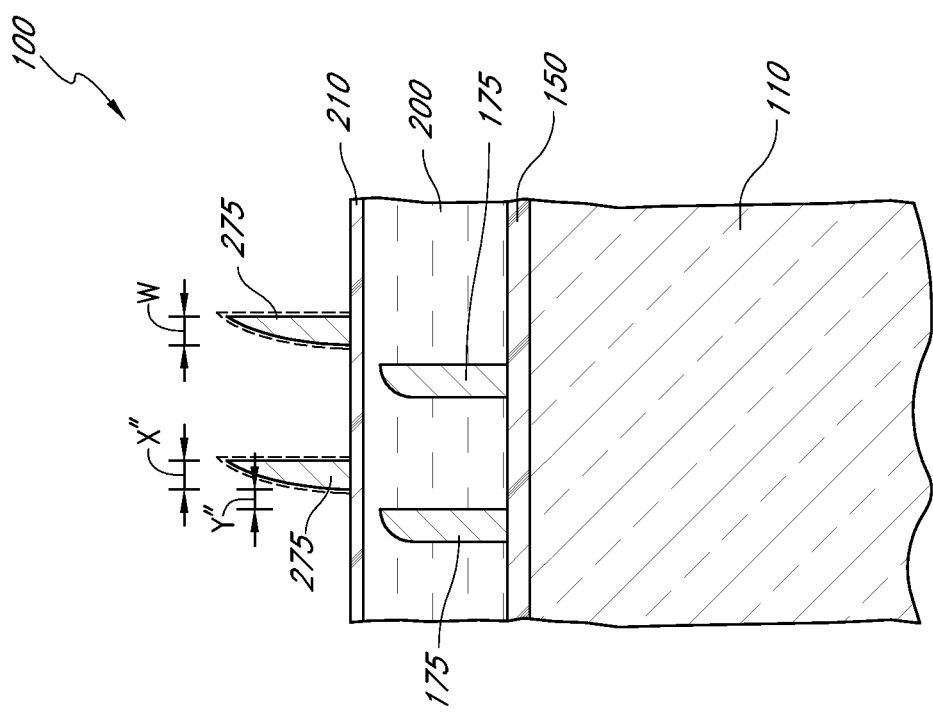
FIG. 19 is a schematic, cross-sectional side view of the partially formed integrated circuit of FIG. 18 after etching the remaining spacers on the second level to desired dimensions, in accordance with preferred embodiments of the invention.

Depending on the width of the spacer material and its spacing from the spacer $175_R$, the spacer material is subjected to a first trim etch to approximately center the structures 270 on the desired positions of the soon to be formed spacers 275 (FIG. 19), as shown in FIG. 17. The position of the spacer material 270 before the etch is shown in dotted lines. Note that the "centering" does not necessarily position the structures 270 exactly centered on the positions of the spacers 275 (FIG. 19). Rather, the centering preferably positions the spacers 275 so as to account for the slightly different etch rates, $E_L$ and $E_R$, at different sides of the spacer. For example, where $E_R$ is greater than $E_L$, the structures 270 may be slightly skewed to the right of being exactly centered on the spacers 275 (FIG. 19).

The first trim etch is preferably an isotropic etch. Exemplary isotropic etch chemistries for silicon oxide spacer material include $SF_6$ and/or $NF_3$. If as shown in FIG. 16, the spacer etch was incomplete, the first trim etch removes the thin bridging layers 271 of spacer material. After the first trim etch, the spacer material 270 is laterally spaced from the spacer $175_R$ by Y'.

Figure 18:
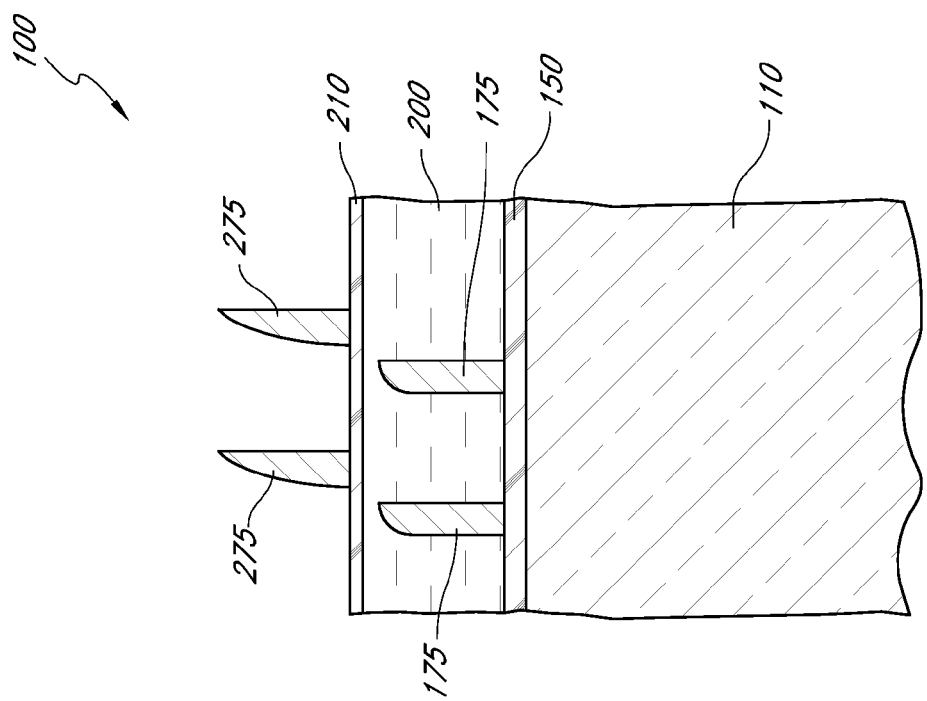
FIG. 18 is a schematic, cross-sectional side view of the partially formed integrated circuit of FIG. 17 after selectively removing mandrels and selected spacers on the second level, in accordance with preferred embodiments of the invention.

As shown in FIG. 18, the mandrels 245 and spacer material 270 on one side of each mandrel 245 are then removed, forming spacers 275. This removal can be accomplished as discussed above with reference to FIGS. 10-13.

Now preferably approximately centered on their desired positions, the spacers 275 are subjected to another isotropic trim etch to form spacers 275 having the desired width. Unlike the trim etch with the mandrels 245 in place, this second trim etch affects both edges of the exposed spacers 275. The duration, t, of this second trim etch can be calculated based upon the following relationship:

$$(X-Y)-E_L t-E_R t=W=X''-Y''$$

where:
X is the lateral distance from the right edge of the spacer 275 to the spacer 175 before second trim etch,
Y' is the lateral distance from the left edge of the spacer 275 to the spacer 175 before second trim etch,
$E_L$t is the etch rate at the left side of the spacer 275,
$E_R$t is the etch rate at the right side of the spacer 275,
W is the desired width for the spacer 275 after etching,
X" is the lateral distance from the left edge of the spacer 275 to the spacer 175 after etching, and Y" is the lateral distance from the right edge of the spacer 275 to the spacer 175 after etching.

It will be appreciated that X and Y' are typically measured values, as discussed above. Alternatively, Y' can be calculated based upon the measured value for Y, the etch rate of the first trim etch and the duration of the first trim etch. $E_L$ and $E_R$ are experimentally determined values for a given etch chemistry under particular process conditions. The etch rates for the left and right sides of the spacers 275 can be different due to the different geometries of those sides; that is, because one side extends vertically and because the other side is at an angle to the horizontal, the rate at which each side is laterally displaced by an etch can vary. W is a desired value, e.g., 50 nm. Thus, the second trim etch time t can be calculated by the following equation:

$$t = \frac{(X - Y') - W}{E_L + E_R}.$$

Having calculated time t, the spacers 275 are subjected to an isotropic trim etch for that time t. With reference to FIG. 19, the position of the spacers 275 before the etch is shown in dotted lines. A suitable chemistry for the second trim etch is a fluorocarbon etch, comprising, e.g., $C_xF_y$ or $C_xF_yH_z$. After the second trim etch, the lateral distance from the left edge of the spacer 275 to the spacer 175 is X" and the lateral distance from the right edge of the spacer 275 to the spacer 175 is Y".

Figure 20:
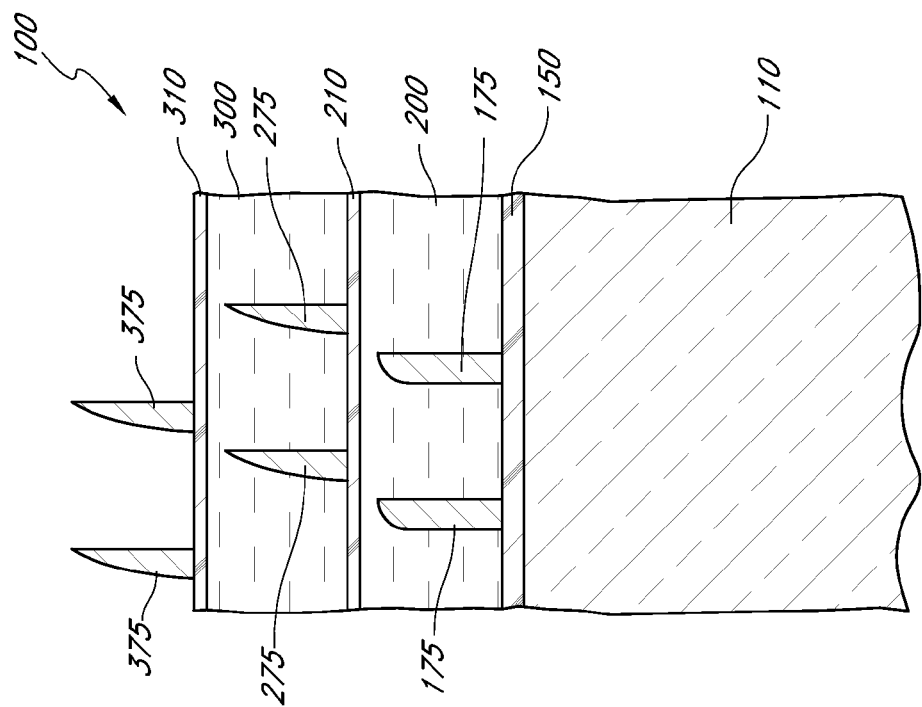
FIG. 20 is a schematic, cross-sectional side view of the partially formed integrated circuit of FIG. 19 after forming spacers on a third level, in accordance with preferred embodiments of the invention.

With reference to FIG. 20, another planarizing layer 300 is formed around the spacers 275 and a hard mask layer 310 is formed over the planarizing layer 300. The planarizing layer can be formed of, e.g., amorphous carbon and the hard mask layer 310 can be formed of, e.g., silicon or a DARC. It will be appreciated that the layer 300 can be planarized by CMP, as discussed above. The steps discussed with reference to FIGS. 14A-19 can then be performed again to leave a pattern of third spacers 375 on a third level, above the second spacers 275.

Figure 21:
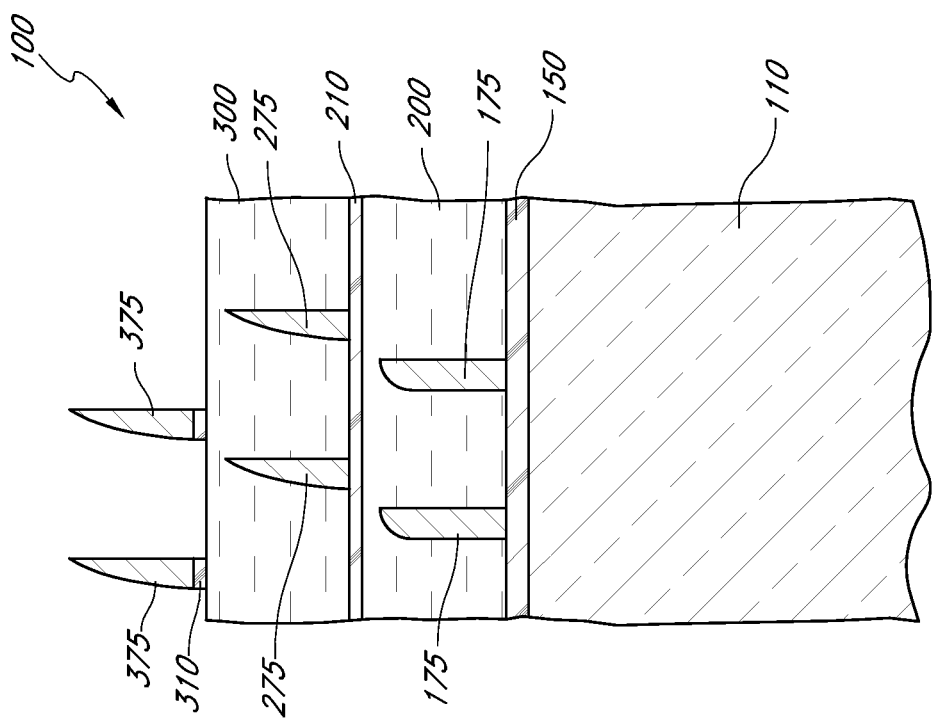
FIG. 21 is a schematic, cross-sectional side view of the partially formed integrated circuit of FIG. 22 after selectively etching a hard mask layer, in accordance with preferred embodiments of the invention.

Next, a pattern defined by all the spacers 175, 275 and 375 is consolidated on a single level. As shown in FIG. 21, spacers 375 are used as a mask to pattern the hard mask layer 310. The hard mask layer is preferably selectively etched relative to the spacers 375 and the planarizing layer 300 using an anisotropic etch, such as an etch using a fluorocarbon plasma, where the layer 310 comprises a DARC. Preferred fluorocarbon plasma etch chemistries include $CFH_3$, $CF_2H_2$, $CF_3H$, $C_4F_8$, $C_3F_6$ and/or $CF_4$.

Figure 22:
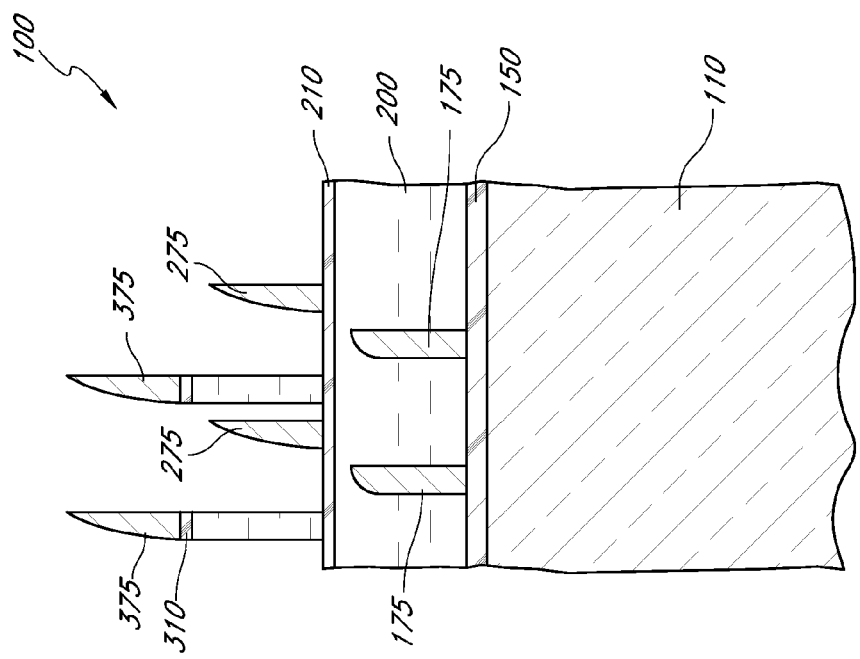
FIG. 22 is a schematic, cross-sectional side view of the partially formed integrated circuit of FIG. 21 after consolidating the spacer patterns on the second and third levels on the first level, in accordance with preferred embodiments of the invention.

The planarizing layer 300 can then be selectively and anisotropically etched, as shown in FIG. 22. Where the planarizing layer 300 is formed of amorphous carbon, preferred etch chemistries include a $SO_2$-containing plasma, e.g., a plasma containing $SO_2$, $O_2$ and Ar.

Figure 23:
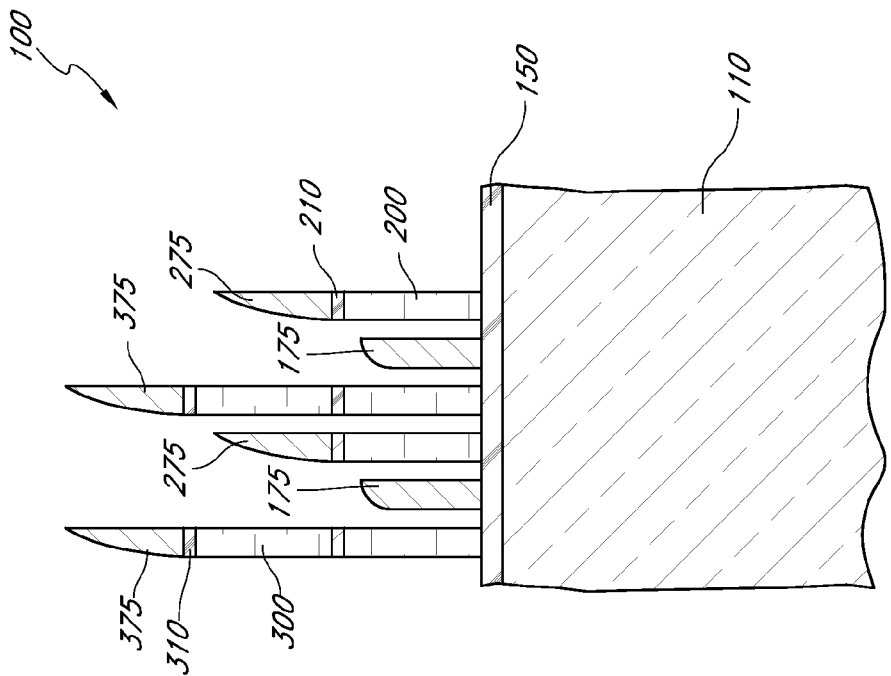
FIG. 23 is a schematic, cross-sectional side view of the partially formed integrated circuit of FIG. 24 after selectively etching a hard mask layer, in accordance with preferred embodiments of the invention.

As with the layers 300 and 310, the hard mask layer 210 and the planarizing layer 200, respectively, are subjected to selective anisotropic etches, thereby consolidating a pattern formed by the spacers 175, 275 and 375 on the first level. The resulting structure is shown in FIG. 23.

Figure 24:
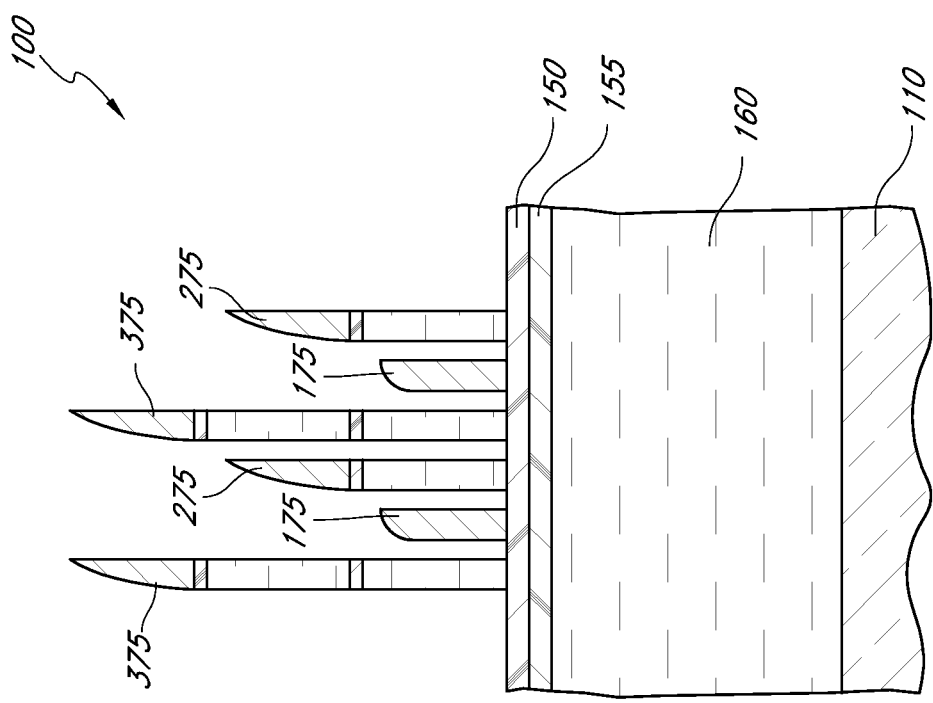
FIG. 24 is a schematic, cross-sectional side view of the partially formed integrated circuit of FIG. 23 overlying a primary masking layer, in accordance with preferred embodiments of the invention.

In some embodiments, particularly where the substrate 110 can be etched with good selectivity relative to the hard mask layer 150, the hard mask layer 150 can be used as a mask to etch the substrate 110. The pattern formed by the spacers 175, 275 and 375 can be transferred from the first level to the hard mask layer 150 by using an anisotropic etch with HBr and $Cl_2$-containing plasma to etch the layer 150 through that pattern formed by the spacers 175, 275 and 375. Alternatively, at each transfer step, the spacer patterns can be transferred to its immediately underlying hard mask and the spacers removed prior to transferring into the underlying protective layers. In this way, the aspect ratios of the resultant mask features (FIG. 23 or 24) can be reduced prior to transfer to the substrate. Optionally, one or more of the features, such as the spacers 175, 275, 375, overlying the layer 160 can be removed to reduce the aspect ratio of mask features before etching the substrate 110.

Figure 25:
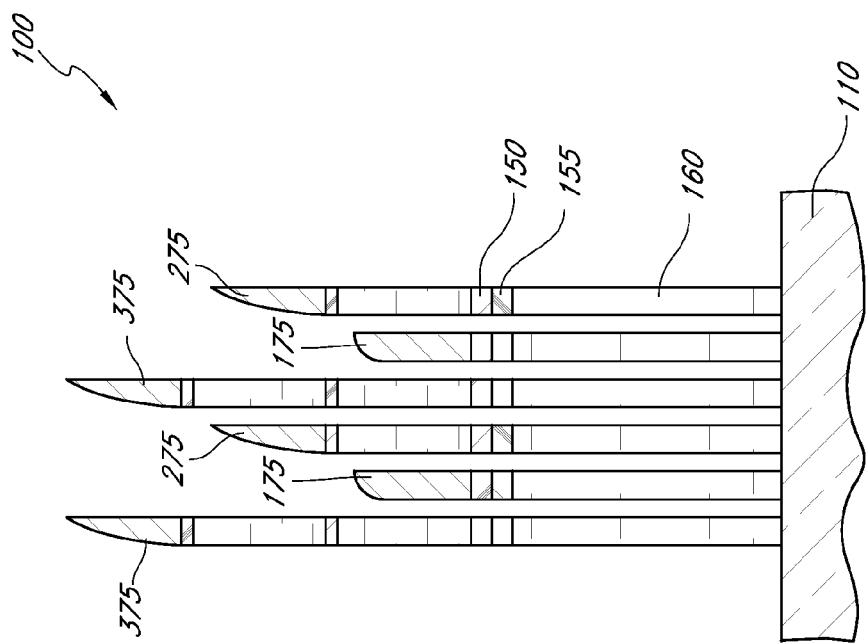
FIG. 25 is a schematic, cross-sectional side view of the partially formed integrated circuit of FIG. 24 after transferring a pattern formed by spacers in the first, second and third levels into the primary masking layer, in accordance with preferred embodiments of the invention.

In other embodiments, especially where the substrate 110 is difficult to etch, intervening layers of masking material can be formed between the hard mask layer 150 and the substrate 110. For example, with reference to FIG. 24, additional layers 155 and 160 can be provided, as discussed in U.S. Patent Provisional Application No. 60/662,323 to Tran et al., filed Mar. 15, 2005, entitled Pitch Reduced Patterns Relative To Photolithography Features, (Micron Ref. No. 2004-1130.00/US), the entire disclosure of which is incorporated herein by reference. The layer 155 allows for a pattern-cleaning step to remove any polymerized organic residue that may be present as the result of previous etch processes. After the cleaning step, a well-defined pattern can be transferred to the layer 160. The layer 160 is preferably formed of amorphous carbon, which is advantageously resistant to many etch chemistries for removing silicon materials in the substrate 110. As shown in FIG. 25, the pattern defined by the spacers 175, 275 and 375 can be transferred to the layer 160, which then serves as the primary mask for patterning the substrate 110. Advantageously, due to the availability of extreme selectivity when etching amorphous carbon, a patterned hard mask layer 150 can be used after removal of spacers to transfer the pattern with lower and more uniform aspect ratio features in the hard mask.

FIGS. 26-35 illustrate other methods for forming a mask pattern, according to other preferred embodiments.

Figure 26:
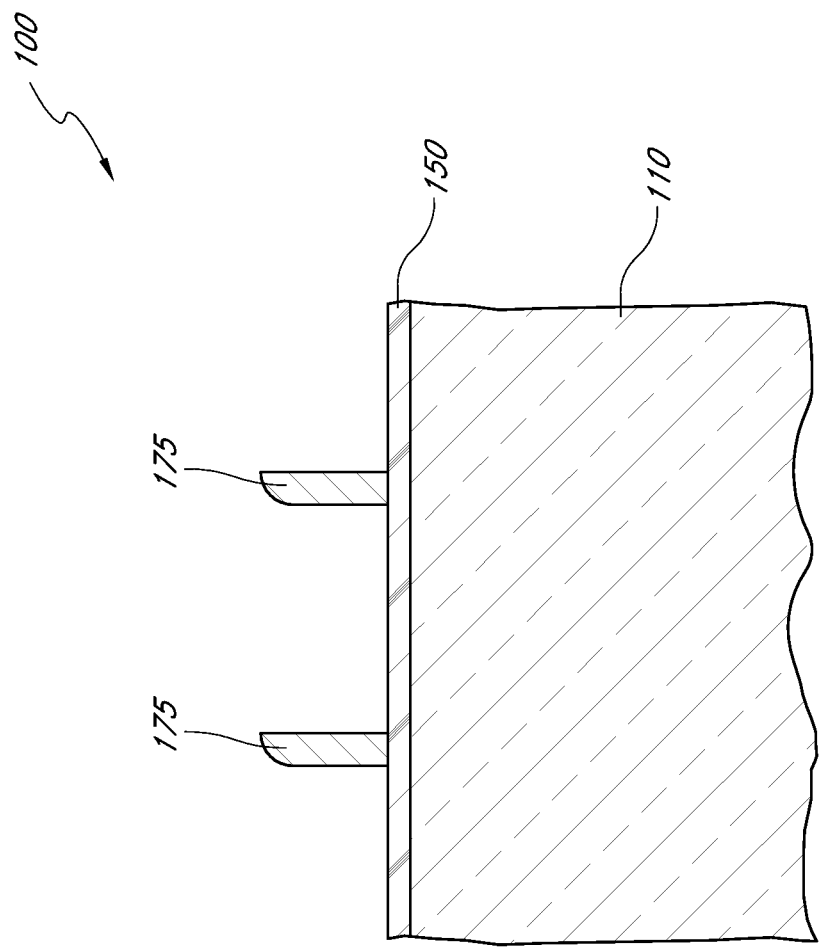
FIG. 26 is a schematic, cross-sectional side view of the partially formed integrated circuit of FIG. 12 after removing the protective layer and the mandrels, in accordance with preferred embodiments of the invention.
Figure 32:
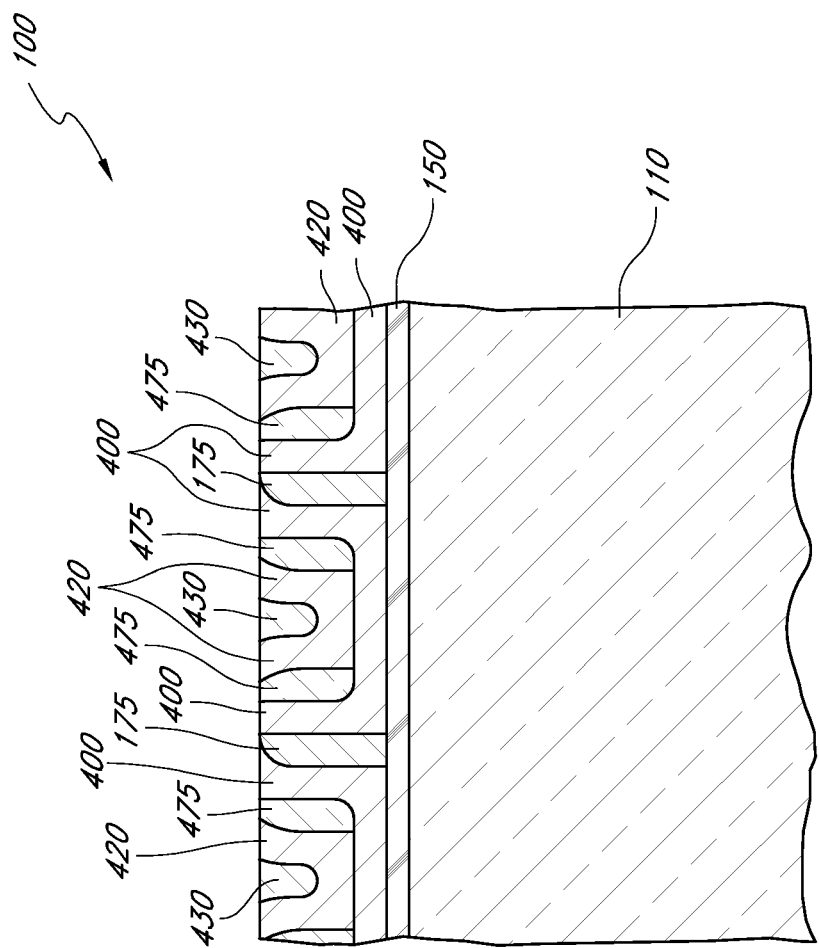
FIG. 32 is a schematic, cross-sectional side view of the partially formed integrated circuit of FIG. 31 after a planarization step, in accordance with preferred embodiments of the invention.
Figure 33:
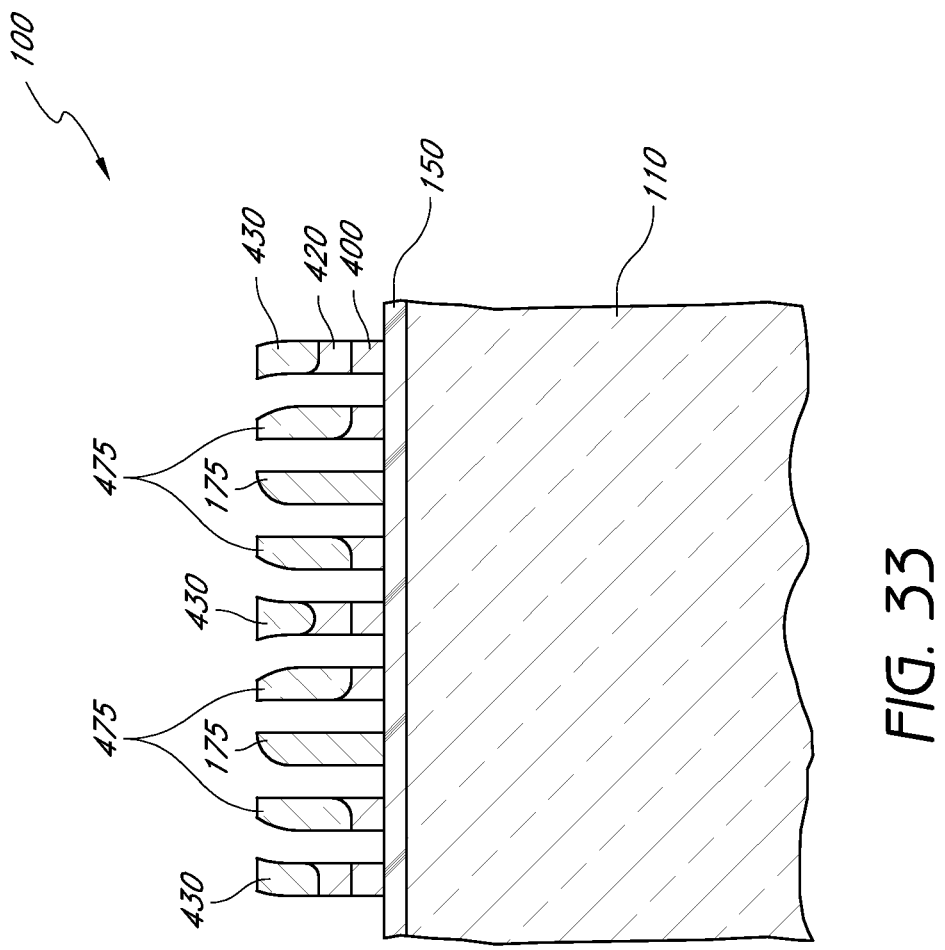
FIG. 33 is a schematic, cross-sectional side view of the partially formed integrated circuit of FIG. 32 after etching the selectively etchable material, in accordance with preferred embodiments of the invention.

With reference to FIG. 26, spacers 175 can be formed as discussed with respect to FIGS. 2-13 above. The spacers 175 can formed of, e.g., silicon oxide. It will be appreciated that the spacing and size of the spacers 175 can be determined with reference to the spacing and size of the features in the mask pattern to be formed (FIGS. 32 and 33). For example, where the mask features to be formed are 25 nm in width and have a regular spacing of about 25 nm or less, the spacing between spacers 175 can be about 175 nm or more, to allow for 3×25 nm features between the spacers 175 and 4×25 nm spaces between the features and the spacers and between each pair of the features. Given features with such small widths, ALD is preferably used to deposit the layers of material which will form the features, as discussed below. It will be appreciated that the spacers 175 can be spaced to accommodate more or fewer than 3 features and 4 spaces.

Figure 27:
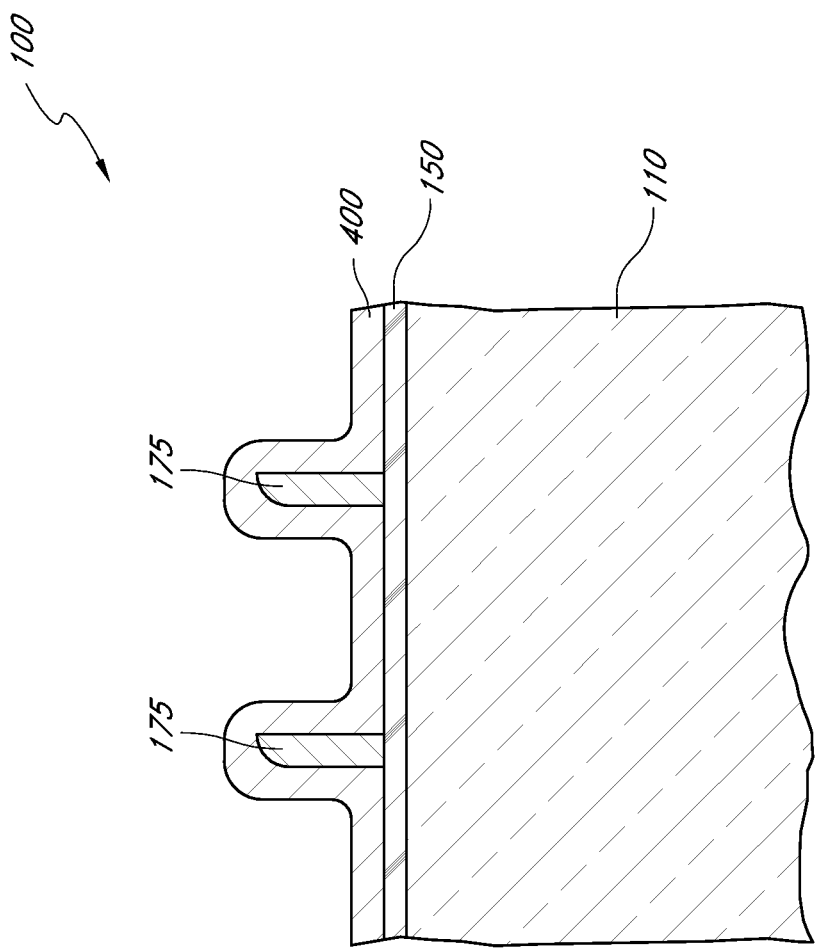
FIG. 27 is a schematic, cross-sectional side view of the partially formed integrated circuit of FIG. 26 after depositing a layer of a material selectively etchable relative to the spacers over the spacers, in accordance with other preferred embodiments of the invention.

A layer 400 is then deposited on the spacers 175 and the hard mask layer 150, as shown in FIG. 27. The layer 400 is formed of a material that can be selectively etched relative to the spacers 175 and that can be deposited with good conformality, uniformity and step coverage. If the features 175 comprise silicon or silicon oxide, the layer 400 can be, e.g., silicon nitride that is deposited by ALD. The thickness of the layer 400 is preferably equal to the desired width between mask features in the later-formed mask (FIGS. 32 and 33).

Figure 28:
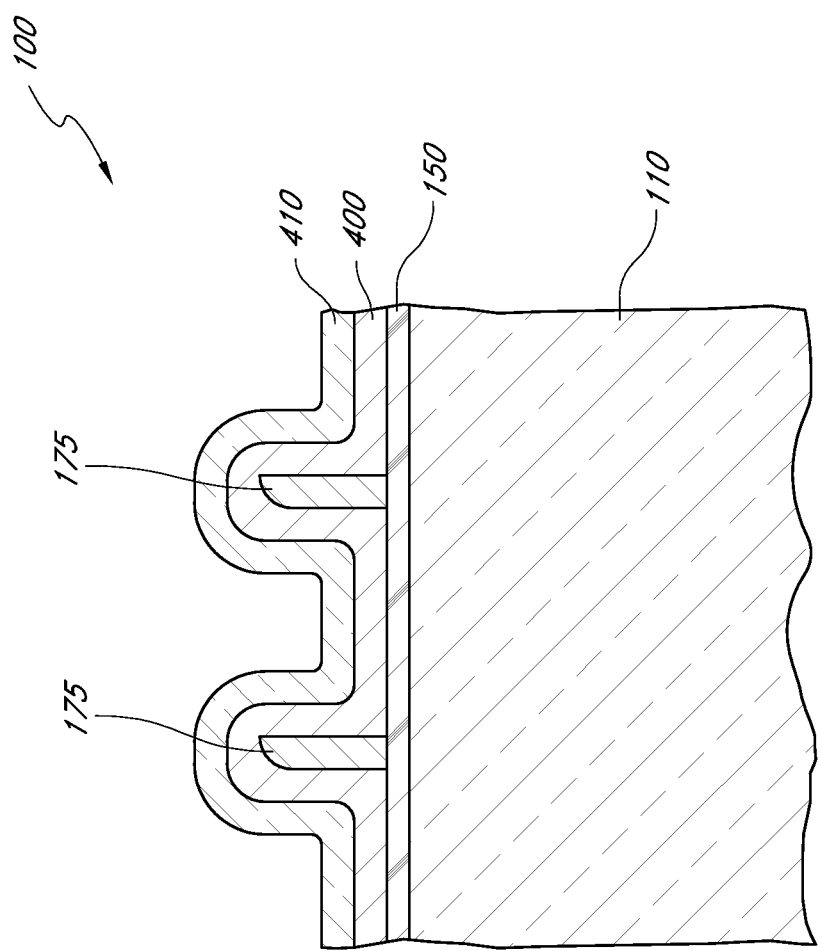
FIG. 28 is a schematic, cross-sectional side view of the partially formed integrated circuit of FIG. 27 after depositing a layer of spacer material, in accordance with other preferred embodiments of the invention.

With reference to FIG. 28, a layer 410 is deposited on the layer 400. The layer preferably comprises the same or similar material, e.g., silicon oxide, as the spacers 175. The layer 410 is preferably deposited by ALD for high conformality, uniformity and step coverage. The layer 410 preferably has a thickness substantially equal to a desired width of later-formed mask features (FIGS. 32 and 33). The layer 410 is then subjected to a spacer etch using, e.g., a fluorocarbon plasma, to form spacers 475, as shown in FIG. 29.

Figure 29:
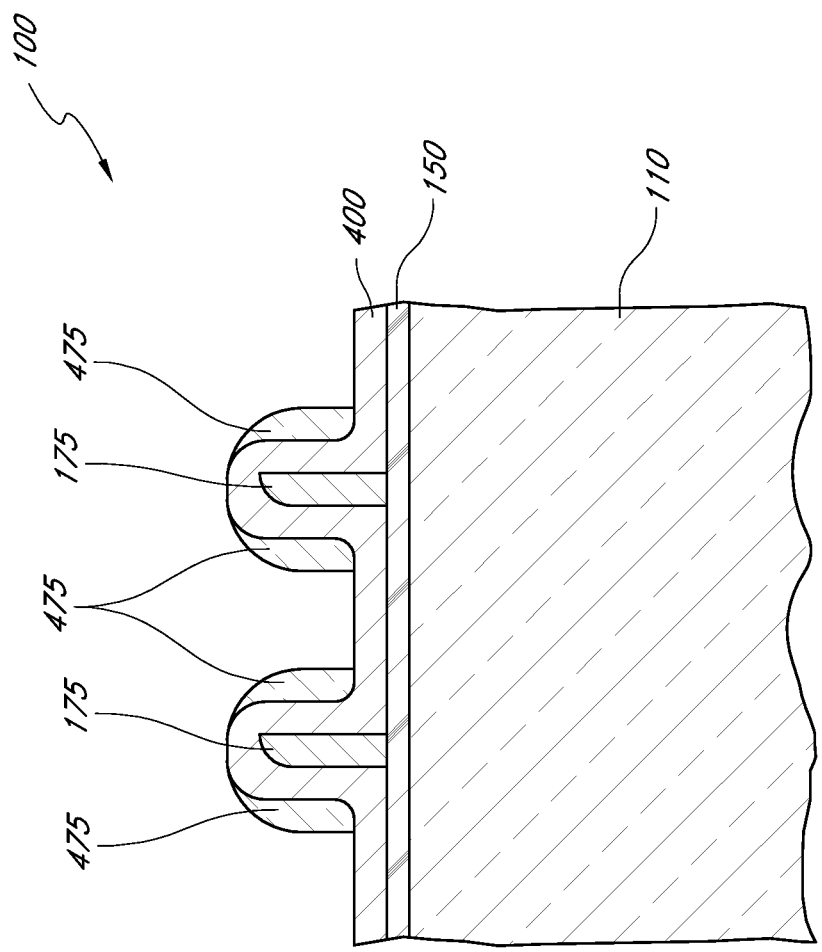
FIG. 29 is a schematic, cross-sectional side view of the partially formed integrated circuit of FIG. 28 after a spacer etch, in accordance with other preferred embodiments of the invention.
Figure 30:
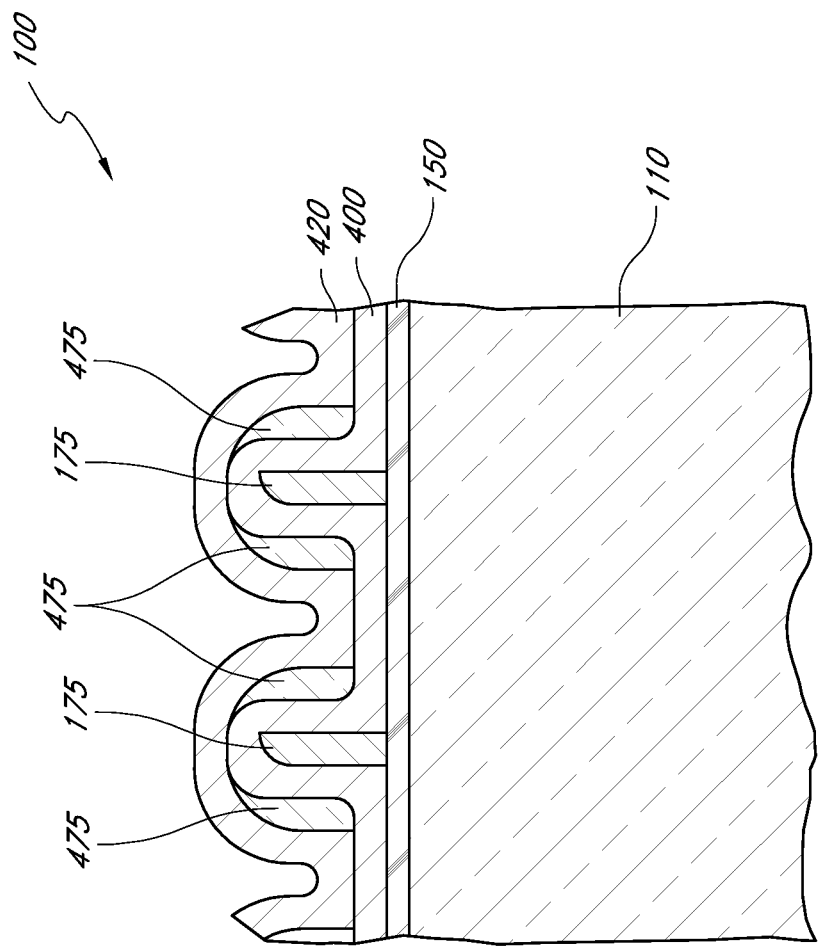
FIG. 30 is a schematic, cross-sectional side view of the partially formed integrated circuit of FIG. 29 after depositing another layer of the selectively etchable material, in accordance with preferred embodiments of the invention.

With reference to FIG. 30, a layer 420 is deposited over the structure of FIG. 29. For simplicity in processing, the layer 420 preferably comprises the same material, e.g., silicon nitride, as the layer 400 and is preferably deposited by ALD. The thickness of the layer 420 is preferably equal to a desired spacing of the mask features (FIGS. 32 and 33).

Figure 31:
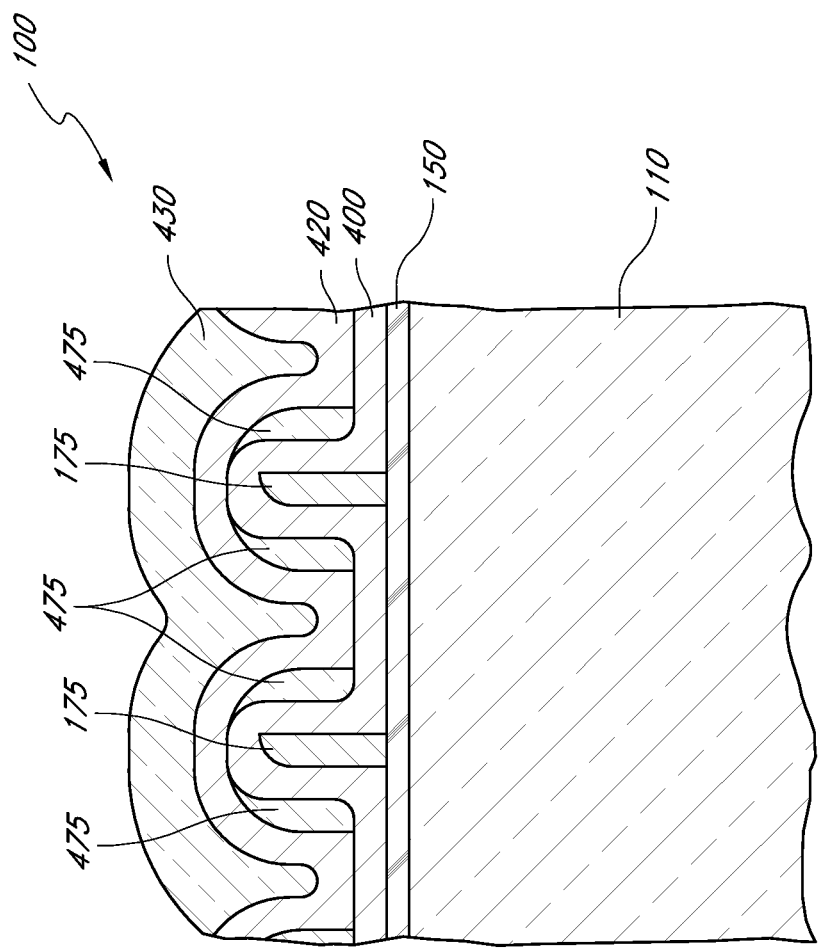
FIG. 31 is a schematic, cross-sectional side view of the partially formed integrated circuit of FIG. 30 after depositing another layer of spacer material, in accordance with preferred embodiments of the invention.

With reference to FIG. 31, a layer 430 is deposited. The layer 430 preferably is formed of the same material, e.g., silicon oxide, as the spacers 175 and is preferably deposited by ALD or another process that has good gap fill characteristics.

It will be appreciated that the layers 400-430 follow the contours of the spacers 175 and the layers 400-420 preferably each has a thickness less than the height of the spacers 175. As a result, each of the layers, as-deposited, has a horizontally extending portion. As shown in FIG. 32, the entire structure can be planarized to leave a portion of each of the layers 400, 420 and 430 and the spacers 475 exposed. The planarization can be achieved by, for example, CMP.

With reference to FIG. 33, the planarized structure is subjected to an anisotropic etch which is preferably selective for the material forming the layers 400 and 420. For example, where the layers 400 and 420 are silicon nitride, a suitable etch chemistry includes a $CF_4$, $CHF_3$, $NF_3$, $C_3F_6$ and/or $C_4F_8$-containing plasma. Parts of the structure unprotected by silicon oxide parts 175, 430 and 475 are etched, leaving behind a pattern of features defined by the parts 175, 430 and 475. It will be appreciated that the height of the spacers 175 is chosen such that each of the parts 475, 420 and 430 have vertically extending portions that are sufficiently tall to allow the planarization process to expose surfaces of those portions while leaving those portions sufficiently tall to effectively transfer patterns to underlying layers via etching.

Figure 34:
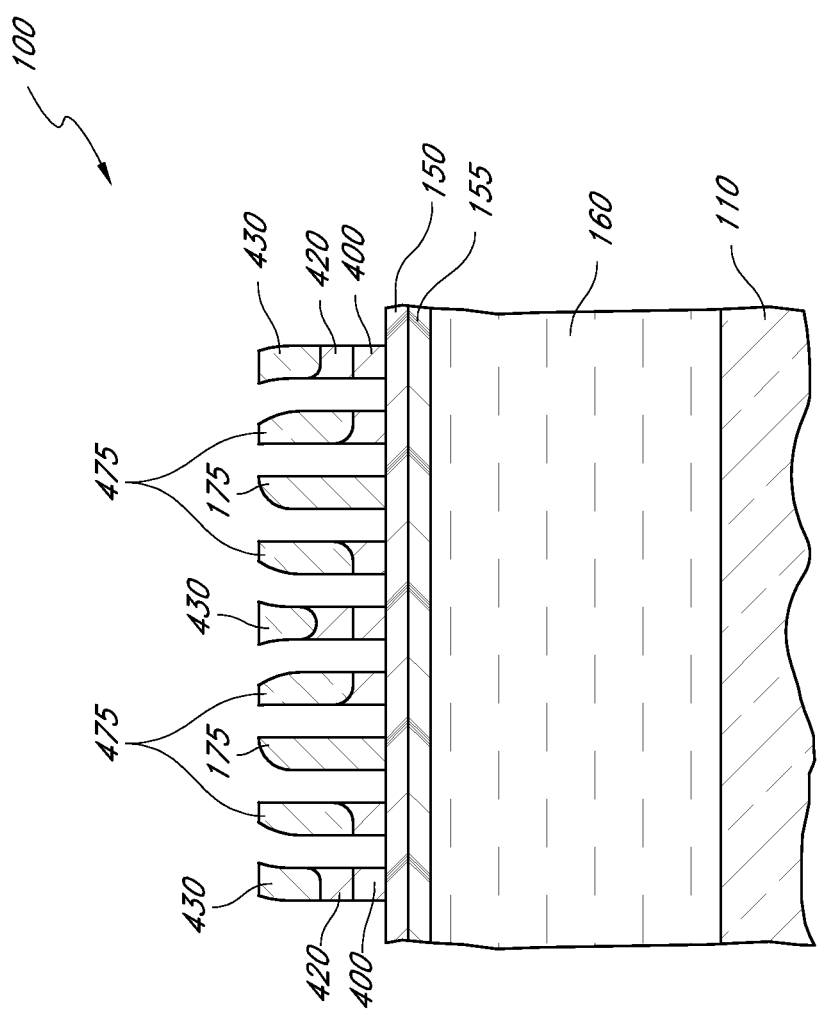
FIG. 34 is a schematic, cross-sectional side view of the partially formed integrated circuit of FIG. 33 overlying a primary masking layer, in accordance with preferred embodiments of the invention.

The pattern defined by the parts 175, 430 and 475 can then be transferred to the hard mask layer 150 by etching the layer 150 through that pattern, using, e.g., a HBr and $Cl_2$-containing plasma etch. Where etches highly selective for the substrate 110 relative to the hard mask layer 150 are available, the hard mask layer 150 can be used as a mask to etch the substrate 110. In other embodiments (FIGS. 34-35), the pattern in the hard mask layer 150 can be transferred to another layer, which is then used as the primary masking layer for patterning the substrate 110. As noted above, an exemplary sequence of layers is illustrated in FIG. 34 and is discussed in U.S. Patent Provisional Application No. 60/662,323 to Tran et al., filed Mar. 15, 2005, entitled Pitch Reduced Patterns Relative To Photolithography Features, (Micron Ref. No. 2004-1130.00/US), the entire disclosure of which is incorporated herein by reference. With reference to FIG. 35, the pattern in the hard mask layer 150 can be transferred to the layer 155, and from the layer 155 to the layer 160. The layer 160 preferably can be etched with good selectivity relative to materials in the substrate 110, particularly when multiple materials are exposed by the mask, and is used as the primary masking layer. Consequently, even where overlying layers may be etched away in the course of patterning the substrate 110, the layer 160 still remains to complete the patterning process.

Thus, it will be appreciated that mask patterns formed according to the preferred embodiments offer numerous advantages. For example, because the formation of mask features is decoupled from the determination of the spacing of the lines, very closely spaced features can be formed. If desired, the spacing between these features can be smaller than the resolution limit of photolithographic techniques used to pattern the mask features. Moreover, precision in spacing these mask features can be improved, since photo-overlay capabilities can be more precise than photolithographic techniques in aligning features and since the formation of features on overlying levels allows active correction of any misalignments via, e.g., measurement of feature positions and trim etches.

In addition, deposition techniques such as CVD and ALD allow good control over the thickness of deposited layers. Thus, using the thickness of deposited layers to determine feature spacing also allows features to be formed with small and precisely defined spacing. Moreover, errors in positioning and spacing caused by photo-misalignment can be minimized, since photolithography is preferably used only in an initial step for defining spacers.

It will be appreciated that while discussed with reference to particular materials for the various layers and parts discussed herein, other materials can also be used. Preferably, however, any other materials that may be used offer the appropriate etch selectivity relative to the materials that are used, as discussed above.

In addition, the masks discussed herein can be used to form various integrated circuit features, including, without limitation, interconnect lines, landing pads and parts of various electrical devices, such as capacitors and transistors, particularly for memory and logic arrays in which dense repeating patterns are desirable. As such, while illustrated as lines with regular spacing and regular widths for ease of illustration, the masks can have features with variable spacing and variable dimensions. For example, with reference to FIG. 23, the spacers 275 on the second level can be formed overlapping the spacers 175 to form a large feature (e.g., a landing pad), can be spaced differently from each of the spacers 175 and 375, can be occur at irregular intervals, can have a different width from the spacers 175 or 375, etc. Also, more than three levels of spacers may be formed, depending upon, for example, the spacing of the spacers 175, 275 and 375, and whether the spacers 275 or 375 occur irregularly, leaving room at some places for other mask features to be formed. The spacers 175 (FIGS. 13 and 26) and 275 and 375 (FIG. 23) can also be more than pitch doubled. An exemplary method for further pitch multiplication is discussed in U.S. Pat. No. 5,328,810 to Lowrey et al. with reference to FIGS. 19-23 of that patent.

In other embodiments, wither reference to FIGS. 13 and 26, rather than removing some spacers 175 on every level, the spacers can be formed having a separation (using a wide mandrel) that is wide enough to accommodate other spacers 275, 375 or mask features 430, 475 in that separation. In other words, paired spacers 175 can be formed having the separation of the "single spacers." In addition, if the spacers 175 have a critical dimension that is within the capabilities of the technique, e.g., photolithography, the used to define the mandrels 124b (FIG. 7), the spacers 175, 275, 375 on each level can be replaced by, e.g., photolithographically defined features. For example, the photographically defined features can be transferred to a layer of amorphous carbon and then to a layer of the same material as the spacers 175, 275, 375. The layer can be formed of, e.g., silicon oxide, to form silicon oxide features on a first level. An amorphous carbon layer, a hard mask layer and a photoresist can then be sequentially overlaid the silicon oxide features to form additional mask features on another level over the silicon oxide features. This process can be repeated to form additional features. By using photo-overlay techniques to position the additional mask features, the spacing between the mask features can be made smaller than the resolution limits of the photolithographic technique used to define the features.

The preferred embodiments can be employed multiple times throughout an integrated circuit fabrication process to form features in a plurality of layers or vertical levels, which may be vertically contiguous or non-contiguous and vertically separated. In such cases, each of the individual levels to be patterned would constitute a substrate 110. In addition, some of the preferred embodiments can be combined with other of the preferred embodiments, or with other masking methods known in the art, to form features on different areas of the same substrate 110 or on different vertical levels.

Accordingly, it will be appreciated by those skilled in the art that these and various other omissions, additions and modifications may be made to the methods and structures described above without departing from the scope of the invention. All such modifications and changes are intended to fall within the scope of the invention, as defined by the appended claims.

We claim:

1. A method for forming an integrated circuit, comprising:
   forming a first plurality of mandrels on a first level over a substrate;
   forming a first plurality of spacers on sidewalls of the first plurality of mandrels;
   forming a second plurality of mandrels on a second level over the first level;
   forming a second plurality of spacers on the sidewalls of the second plurality of mandrels, the second plurality of spacers elongated generally parallel to the first plurality of spacers;
   selectively etching portions of material between spacers of each of the first and the second pluralities of spacers to form a pattern defined by spacers of the first and the second pluralities of spacers; and
   transferring the pattern to the substrate, wherein transferring the pattern to the substrate comprises:
     transferring the pattern to an amorphous carbon layer; and
     subsequently etching the pattern into the substrate.

2. The method of claim 1, wherein forming the first plurality of mandrels comprises patterning a carbon-containing layer to define the first plurality of mandrels in the carbon-containing layer.

3. The method of claim 2, wherein the carbon-containing layer is formed of amorphous carbon.

4. The method of claim 1, wherein forming the first plurality of spacers comprises:
   blanket depositing a layer of spacer material on the first plurality of mandrels; and
   anisotropically etching the layer of spacer material to define the first plurality of spacers.

5. The method of claim 4, wherein forming the second plurality of mandrels comprises:
   depositing a planarization layer around the first plurality of spacers;
   depositing a carbon-containing layer on the planarization layer; and
   patterning the carbon-containing layer to define the second plurality of mandrels.

6. The method of claim 4, wherein forming the second plurality of spacers comprises:
   blanket depositing a layer of spacer material on the second plurality of mandrels; and
   anisotropically etching the layer of spacer material to define the second plurality of spacers.

7. The method of claim 6, further comprising selectively removing alternating ones of the second plurality of spacers.

8. The method of claim 1, wherein selectively etching portions of material between spacers comprises:
   selectively removing the second plurality of mandrels, thereby exposing portions of the material between spacers of the first plurality of spacers; and
   anisotropically etching the exposed portions of the material between spacers of the first plurality of spacers.

9. A method for forming an integrated circuit, comprising:
   sequentially forming spacers on first and second levels, the spacers on the first level elongated generally parallel to the spacers on the second level;
   selectively removing material between the spacers of the first and second levels to form a pattern defined by the spacers on the first and second levels, wherein the material comprises amorphous carbon; and
   transferring the pattern to a substrate.

10. The method of claim 9, further comprising forming spacers on a third level above the first and second levels.

11. The method of claim 9, wherein sequentially forming spacers on the first and second levels comprises:
    forming free-standing spacers on the first level;
    depositing a planarization layer around the free-standing spacers on the first level; and
    forming the spacers of the second level over the planarization layer.

12. The method of claim 9, wherein transferring the pattern to the substrate comprises:
    etching the pattern into a hardmask layer;
    subsequently removing the spacers on the first and second levels; and
    patterning the substrate through the hardmask layer.

13. The method of claim 9, wherein selectively removing comprises:
    etching exposed material between the spacers on the second level to expose material between spacers on the first level; and
    etching the exposed material separating the spacers on the first level.

14. A method for forming an integrated circuit, comprising:
    forming a mask comprising a pattern, the mask comprising:
      spacers on an upper level;
      trimming the spacers on the upper level; and
      spacers on a lower level, the spacers on the lower and upper levels elongated in a same direction; and
    etching the pattern into a substrate.

15. The method of claim 14, wherein forming the mask comprises forming the spacers on the upper level laterally off-set from the spacers on the lower level.

16. The method of claim 14 wherein trimming the spacers on the upper level comprises performing an isotropic etch.

17. The method of claim 14, wherein forming the mask comprises:
    transferring the pattern to a hard mask layer underlying the lower level; and
    subsequently removing the mask,
    wherein etching the pattern into the substrate comprises etching the substrate through the mask.

18. The method of claim 14, wherein etching the pattern into a substrate comprises etching a semiconductor material.

19. A method for forming an integrated circuit, comprising:
    forming a first plurality of mandrels on a first level over a substrate, wherein forming the first plurality of mandrels comprises patterning a carbon-containing layer to define the first plurality of mandrels in the carbon-containing layer, wherein the carbon-containing layer is formed of amorphous carbon;

forming a first plurality of spacers on sidewalls of the first plurality of mandrels;
forming a second plurality of mandrels on a second level over the first level;
forming a second plurality of spacers on the sidewalls of the second plurality of mandrels, the second plurality of spacers elongated generally parallel to the first plurality of spacers;
selectively etching portions of material between spacers of each of the first and the second pluralities of spacers to form a pattern defined by spacers of the first and the second pluralities of spacers; and
transferring the pattern to the substrate.

* * * * *

UNITED STATES PATENT AND TRADEMARK OFFICE
CERTIFICATE OF CORRECTION

| | | |
|---|---|---|
| PATENT NO. | : 8,865,598 B2 | Page 1 of 1 |
| APPLICATION NO. | : 14/094473 | |
| DATED | : October 21, 2014 | |
| INVENTOR(S) | : Sanket Sant et al. | |

It is certified that error appears in the above-identified patent and that said Letters Patent is hereby corrected as shown below:

In the Claims

In column 18, line 26, in Claim 12, delete "hardmask" and insert -- hard mask --, therefor.
In column 18, line 29, in Claim 12, delete "hardmask" and insert -- hard mask --, therefor.

Signed and Sealed this
Thirtieth Day of December, 2014

Michelle K. Lee
*Deputy Director of the United States Patent and Trademark Office*